US009880203B2

(12) United States Patent
Katakura et al.

(10) Patent No.: US 9,880,203 B2
(45) Date of Patent: Jan. 30, 2018

(54) SEMICONDUCTOR DEVICE AND METHOD FOR MANUFACTURING THE SEMICONDUCTOR DEVICE

(71) Applicant: FUJI ELECTRIC CO., LTD., Kawasaki-shi (JP)

(72) Inventors: Hideaki Katakura, Matsumoto (JP); Yoshiaki Toyoda, Matsumoto (JP)

(73) Assignee: FUJI ELECTRIC CO., LTD., Kawasaki-shi (JP)

(*) Notice: Subject to any disclaimer, the term of this patent is extended or adjusted under 35 U.S.C. 154(b) by 296 days.

(21) Appl. No.: 14/622,824

(22) Filed: Feb. 13, 2015

(65) Prior Publication Data

US 2015/0260760 A1    Sep. 17, 2015

(30) Foreign Application Priority Data

Mar. 17, 2014  (JP) .................................. 2014-053393
Aug. 8, 2014   (JP) .................................. 2014-163215

(51) Int. Cl.
| G01R 27/08 | (2006.01) |
| G01R 15/04 | (2006.01) |
| G01R 19/00 | (2006.01) |
| G01R 1/20  | (2006.01) |

(52) U.S. Cl.
CPC ............. G01R 15/04 (2013.01); G01R 1/203 (2013.01); G01R 19/0092 (2013.01)

(58) Field of Classification Search
CPC ..... G01R 15/04; G01R 1/203; G01R 19/0092
USPC ......................................................... 324/715
See application file for complete search history.

(56) References Cited

U.S. PATENT DOCUMENTS

| 4,442,397 A * | 4/1984 | Ishikawa ................. G05F 1/468 323/275 |
| 6,011,413 A * | 1/2000 | Hayakawa ......... G01R 19/0092 327/51 |
| 6,191,454 B1* | 2/2001 | Hirata ................. H01L 27/0251 257/355 |
| 6,204,699 B1* | 3/2001 | Shimazaki ....... G01R 19/16552 327/63 |

(Continued)

FOREIGN PATENT DOCUMENTS

| JP | S62-193571 U | 12/1987 |
| JP | H04-137559 A | 5/1992 |

(Continued)

*Primary Examiner* — Patrick Assouad
*Assistant Examiner* — Demetrius Pretlow
(74) *Attorney, Agent, or Firm* — Rabin & Berdo, P.C.

(57) ABSTRACT

Current detection circuit of a semiconductor device provided with a shunt resistor, a voltage division ratio adjustment resistor and a selection circuit which selects a voltage division ratio of the latter and has enhancement type MOS-FETs and Zener Zaps as trimming elements. One of the Zener Zaps is trimmed and a divided voltage of the voltage division ratio adjustment resistor connected in parallel with the shunt resistor is outputted. The detected voltage in which variation of the resistance of the shunt resistor has been cancelled is therefore outputted. As the shunt resistor and the voltage division ratio adjustment resistor are laminated together, it is possible to obtain a current detection circuit with a small area, which can detect a current flowing into a shunt resistor with high accuracy.

14 Claims, 23 Drawing Sheets

(56) References Cited

U.S. PATENT DOCUMENTS

| | | | | |
|---|---|---|---|---|
| 2003/0193361 A1* | 10/2003 | Romas, Jr. | ............. | H01C 17/24 |
| | | | | 327/308 |
| 2006/0103409 A1 | 5/2006 | Shigeta et al. | | |
| 2009/0167265 A1* | 7/2009 | Vanderzon | ........... | H03K 17/133 |
| | | | | 323/271 |
| 2012/0092078 A1 | 4/2012 | Kai | | |
| 2013/0187471 A1* | 7/2013 | Kim | ......................... | H02J 1/10 |
| | | | | 307/66 |

FOREIGN PATENT DOCUMENTS

| | | |
|---|---|---|
| JP | 2005-234781 A | 9/2005 |
| JP | 2006-136086 A | 5/2006 |
| JP | 2011-040497 A | 2/2011 |
| JP | 2012-085163 A | 4/2012 |

* cited by examiner

SEMICONDUCTOR DEVICE AND METHOD FOR MANUFACTURING THE SEMICONDUCTOR DEVICE

CROSS-REFERENCE TO RELATED APPLICATIONS

This application claims priority from Japanese Patent Application JP 2014-053393, filed on Mar. 17, 2014, and from Japanese Patent Application JP 2014-163215, filed on Aug. 8, 2014, both of which are hereby incorporated by reference.

BACKGROUND OF THE INVENTION

1. Field of the Invention

The present invention relates to a semiconductor device having a current detection circuit and a method for manufacturing the semiconductor device.

2. Description of the Background Art

Recently, the field of automotive electronics has been rapidly developed due to the increase of social awareness of car safety, low fuel consumption and pollution reduction.

To detect a current value flowing into a system (device) such as an on-vehicle transmission, a current detection resistor (hereinafter referred to as shunt resistor) is disposed in the system. A voltage drop in the shunt resistor is measured to perform current-voltage conversion and obtain a voltage value (hereinafter referred to as detected voltage value) based on a current value to be detected. The detected voltage value is converted into a current value by arithmetic processing in a control circuit in the system.

It is desirable that the shunt resistor has low resistance in order to reduce power loss. It is therefore desirable that the shunt resistor is constituted by a resistor with a small sheet resistance value. A metal wire of Al—Si—Cu (aluminum-silicon-copper) or the like (hereinafter referred to as Al—Si—Cu metal wire), a diffused resistor in which high concentration impurities have been implanted, a polysilicon (poly-Si) resistor, etc. may be used as the shunt resistor.

The resistance value of the shunt resistor may vary due to manufacturing factors etc. When the resistance value of the shunt resistor varies, a desired detected voltage value cannot be obtained but an error is caused in detection of the current value. When the error in detection of the current value affects operation of the system, trimming (adjustment) should be performed on the shunt resistor. Next, a method for trimming the shunt resistor will be described. FIG. 17 is a circuit diagram showing the circuit configuration of a current detection circuit according to the background art.

In the current detection circuit shown in FIG. 17, an MOSFET (Metal Oxide Semiconductor Field Effect Transistor) 62 is used as an MOS type shunt resistor and trimming is performed by use of change of an ON resistance of the MOSFET 62 caused by a gate voltage. This current detection circuit has been disclosed, for example, in JP-A-2005-234781 (FIG. 1). In FIG. 17, the reference sign 52 denotes a current control element; 53, a load resistor; 54, a current mirror circuit; 54a and 54b, pnp transistors; 55a and 55b, constant current sources; 56, an operational amplifier; 61, a constant current control circuit device; 62, a p channel MOSFET (resistance control element); 63, an emitter resistor; 64, a CrSi (chrome silicon) resistor; and 65, a temperature characteristic correction circuit.

In addition, another trimming method will be described. FIG. 18 is a plan view showing a main part of the configuration of a trimming resistor element 80 according to the background art. The trimming resistor element 80 shown in FIG. 18 is provided with a plurality of double resistance region type trimming resistors 71-1 to 71-9 each partially having a high resistance region RH and a single resistance type trimming resistor 71-10 entirely having a high resistance region RH. This trimming resistor element 80 is formed in the system in advance. Metal wires 74-1 and 74-2 connecting these trimming resistors 71-1 to 71-10 are cut off by a laser to perform trimming. Such a trimming method has been disclosed, for example, in JP-A-2011-40497 (FIG. 8).

JP-UM-A-62-193571 discloses a large current measurement device which applies a current to a resistor line, measures a voltage generated in the resistor line, converts the measured voltage into a current value and displays the current value, wherein: a variable resistor (not lower than twice as high as a resistance value of $100\Omega$) is connected between opposite ends of the resistor line and adjusted to make a voltage value between opposite ends of the variable resistor equal to a predetermined voltage value when a specific current is applied to the resistor line.

In addition, JP-A-4-137559 and JP-A-2012-85163 disclose a semiconductor integrated circuit in which a variable resistor is constituted by a circuit formed by connecting a plurality of resistors in series and a selection circuit.

In addition, JP-A-2006-136086 (FIG. 2) disclose a method in which a source-drain voltage of an MOSFET is divided by two resistive elements with different temperature coefficients so that change of a detected voltage caused by an operating temperature can be corrected and a source-drain current flowing into the MOSFET can be obtained with high accuracy.

However, in the method in which the MOSFET 62 is used as a shunt resistor as in the aforementioned FIG. 17 or the aforementioned JP-A-2005-234781 (FIG. 1), it is necessary to apply analog control to the gate voltage by means of the operational amplifier etc. in order to correct a variation of the resistance value of the shunt resistor. The circuit for controlling the gate voltage becomes complicated as illustrated.

In addition, in the method in which the trimming resistor element 80 is used as a shunt resistor and the shunt resistor is directly trimmed as in the aforementioned FIG. 18 or the aforementioned JP-A-2011-40497 (FIG. 8), the circuit can be simplified but an expensive device such as a laser cutting device is required for the trimming.

In the aforementioned JP-A-2006-136086 (FIG. 2), an error in detection of the current value is caused when the ON resistance of the MOSFET or the resistance value of the voltage division resistor changes due to some process variation etc.

In addition, in response to a request to miniaturize the system, it is desired that the low-resistance shunt resistor can be obtained in a small area when the shunt resistor is disposed on the same chip as the integrated circuit (IC) including the control circuit.

SUMMARY OF THE INVENTION

In order to solve the foregoing problems inherent in the background art, an object of the invention is to provide an inexpensive semiconductor device which has a current detection circuit occupying a small area and a method for manufacturing the semiconductor device.

In order to solve the foregoing problems and attain the object of the invention, a semiconductor device according to the invention has the following characteristics. That is, the semiconductor device has a voltage detection circuit including: a current detection resistor; a voltage division ratio adjustment resistor which is connected in parallel with the current detection resistor and which is higher in resistance than the current detection resistor; a plurality of voltage division points at which the voltage division ratio adjustment resistor is divided into different voltage division ratios respectively; and a selection circuit which selects a voltage division point. The current detection resistor, the voltage division ratio adjustment resistor, the voltage division points and the selection circuit are provided in the same semiconductor substrate. The selection circuit selects one from the voltage division points based on a resistance value of the current detection resistor so that the voltage detection circuit can output a voltage at the voltage division point selected by the selection circuit as a detected voltage.

In addition, according to the invention, there is provided a semiconductor device in the aforementioned configuration, wherein: the current detection resistor is laminated and disposed on the voltage division ratio adjustment resistor through an interlayer insulating film. Accordingly, the area occupied by the current detection circuit can be reduced preferably.

In addition, according to the invention, there is provided a semiconductor device in the aforementioned configuration, wherein: the current detection resistor may be a metal wire, a diffused resistor or a polysilicon resistor and set to have low resistance.

In addition, according to the invention, there is provided a semiconductor device in the aforementioned configuration, wherein: the selection circuit is constituted by a plurality of switching elements and trimming elements which are equal in number to the switching elements. The trimming elements are connected to different gates of the switching elements respectively. Configuration may be made so that high potential sides of the switching elements (for example, drains of n-channel MOSFETs) can be connected to the different voltage division points respectively.

In addition, according to the invention, there is provided a semiconductor device in the aforementioned configuration, wherein: the switching elements may be metal oxide semiconductor field effect transistors.

In addition, according to the invention, there is provided a semiconductor device in the aforementioned configuration, wherein: the trimming elements may be Zener diodes or fuses.

In addition, according to the invention, there is provided a semiconductor device in the aforementioned configuration, wherein: the voltage division ratio adjustment resistor includes: a first voltage division resistor; a second voltage division resistor which has the voltage division points and which is connected in series with the first voltage division resistor on a low potential side of the first voltage division resistor; and a plurality of trimming elements which are connected in series with one another and which are connected in parallel with the first voltage division resistor. A resistance value of the first voltage division resistor may be controlled by the plurality of trimming elements to adjust a temperature coefficient of the voltage division ratio adjustment resistor.

In addition, according to the invention, there is provided a semiconductor device in the aforementioned configuration, wherein: a temperature coefficient of the second voltage division resistor may be smaller than a temperature coefficient of the first voltage division resistor.

In addition, a method for manufacturing the semiconductor device according to the invention is a method for manufacturing the aforementioned semiconductor device, wherein: when the reference sign Rshav denotes an average value of a variation of a resistance value Rsh of the current detection resistor; RshH, a higher resistance value than the average value Rshav; RshL, a lower resistance value than the average value Rshav; Rd1, a first resistance value at a predetermined one of the voltage division points of the voltage division ratio adjustment resistor Rdo; RdH, a second resistance value higher than the first resistance value Rd1; RdL, a third resistance value lower than the first resistance value Rd1; So, a voltage division ratio for the first resistance value Rd1; SH, a voltage division ratio for the second resistance value Rd2; and SL, a voltage division ratio for the third resistance value Rd3, the voltage division ratios may be set to establish the relation Rshav×So=RshH×SL=RshL×SH, and the selection circuit may select one from the voltage division points corresponding to the voltage division ratios. The sentence "the selection circuit selects one from the voltage division points" means that the selection circuit selects a detected voltage line connected to the voltage division point corresponding to the voltage division ratio.

According to the semiconductor device and the method for manufacturing the semiconductor device according to the invention, it is possible to provide an inexpensive semiconductor device which has a current detection circuit occupying a small area.

DETAILED DESCRIPTION OF THE INVENTION

Preferred modes for carrying out a semiconductor device and a method for manufacturing the semiconductor device according to the invention will be described in detail below with reference to the accompanying drawings. In this specification and the accompanying drawings, any layer or region prefixed with n or p means that the layer or region contains electrons or holes as majority carriers. In addition, "+" or "−" suffixed to n or p means that any layer or region having "+" or "−" suffixed to n or p has higher impurity concentration or lower impurity concentration than any layer or region having no "+" or "−" suffixed to n or p. Incidentally, in the description of the following modes and the accompanying drawings, the same constituent members are referred to by the same numerals correspondingly and duplicate description thereof will be omitted.

The semiconductor device according to the invention is provided with a current detection circuit including a shunt resistor, a voltage division ratio adjustment resistor and a selection circuit. The selection circuit is constituted by combinations of MOSFETs and trimming elements to select a voltage division ratio of the voltage division ratio adjustment resistor. Each of the trimming elements is a Zener Zap or a polysilicon (poly-Si) fuse. For example, a metal wire of Al—Si—Cu or the like having low specific resistance, or a polysilicon resistor or diffused resistor etc. having low resistance may be used as the shunt resistor Rsh. A diffused resistor or a polysilicon resistor etc. may be used as the voltage division ratio adjustment resistor.

The Zener Zap is a Zener diode which can be short-circuited in order to adjust (trim) the voltage division ratio of the voltage division ratio adjustment resistor. When a large avalanche current (breakdown current) or forward current is applied, a pn junction between the anode and the cathode of the Zener Zap is broken down to thereby short-circuit the Zener Zap. Thus, the resistance value of the shunt resistor Rsh can be adjusted.

The modes for carrying out the invention will be described in the following embodiments.

Embodiment 1

Figure 1:
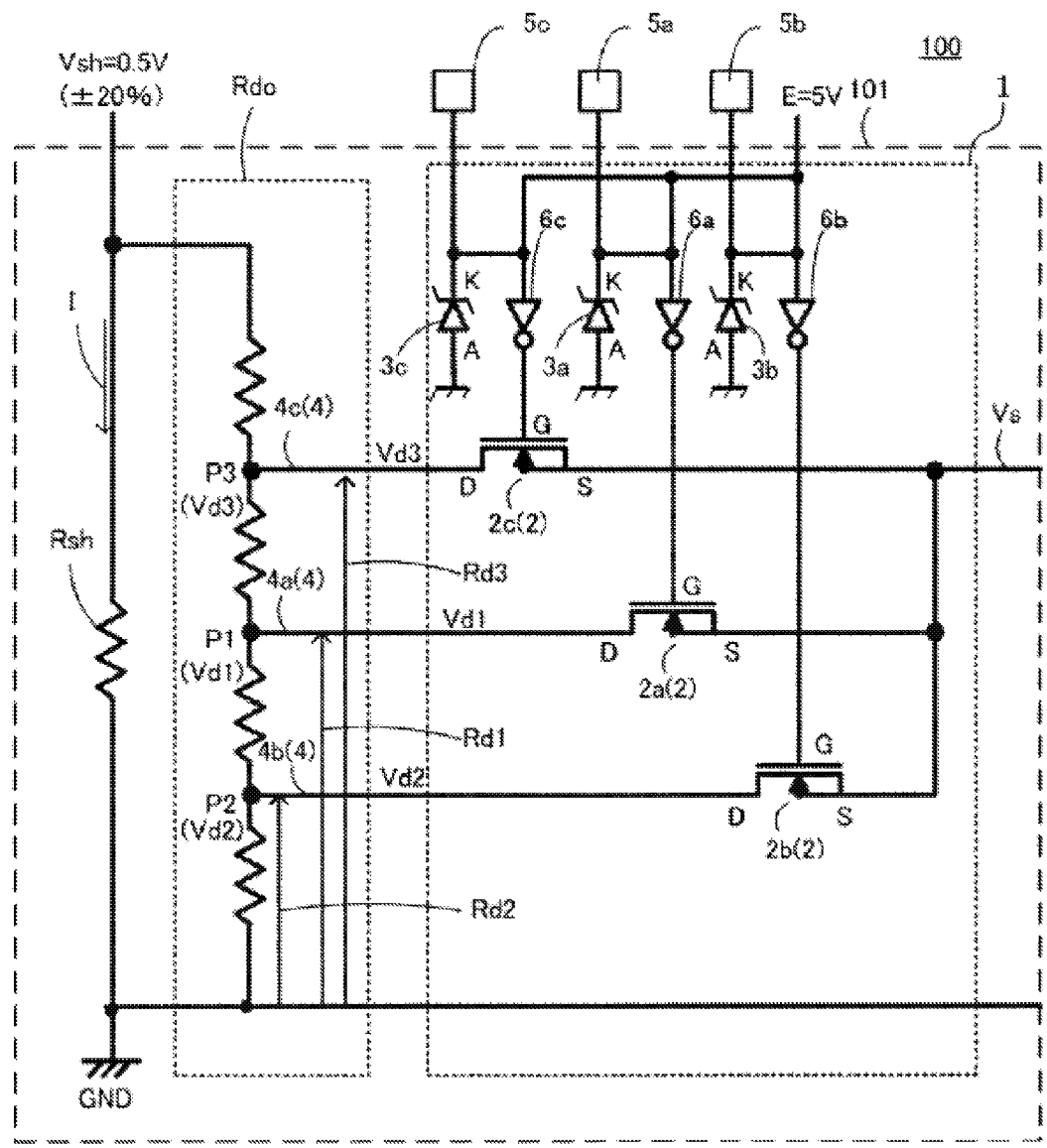
FIG. 1 is a circuit diagram showing the circuit configuration of a current detection circuit 101 for detecting a current with high accuracy by use of a shunt resistor Rsh.
Figure 2:
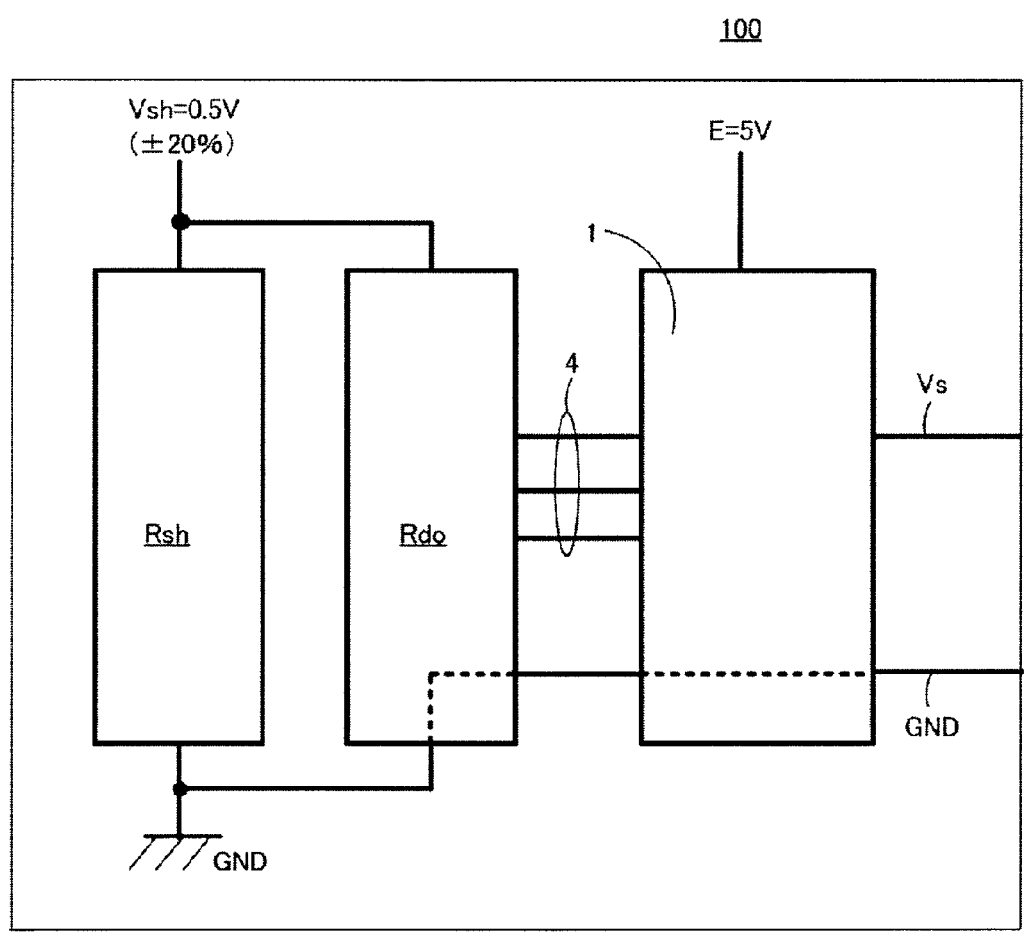
FIG. 2 is an explanatory view showing the layout of a semiconductor device 100 having the current detection circuit 101.
Figure 3:
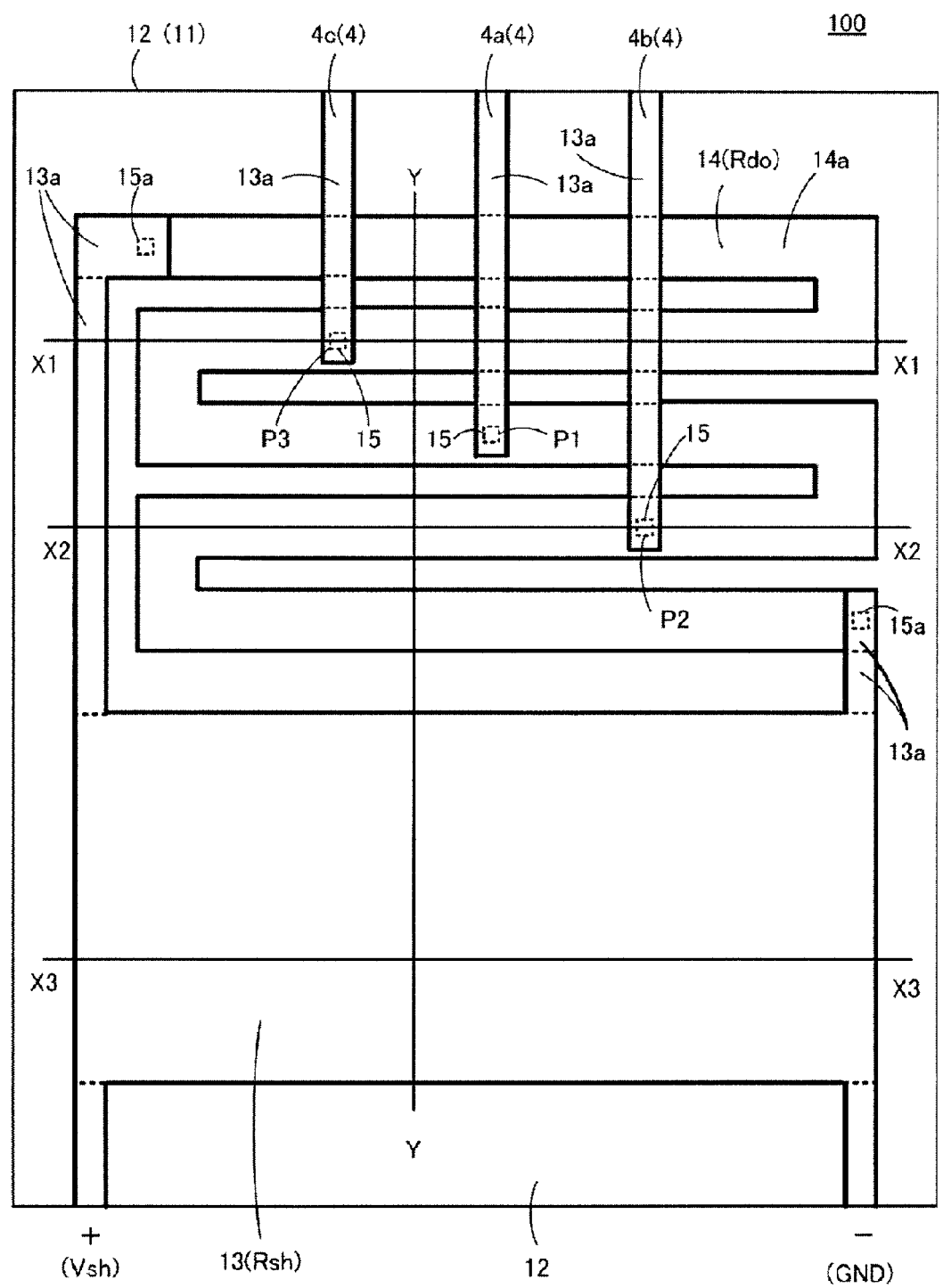
FIG. 3 is a plan view showing a main part of the semiconductor device 100 in which the shunt resistor Rsh and a voltage division ratio adjustment resistor Rdo are formed.
Figure 4A:
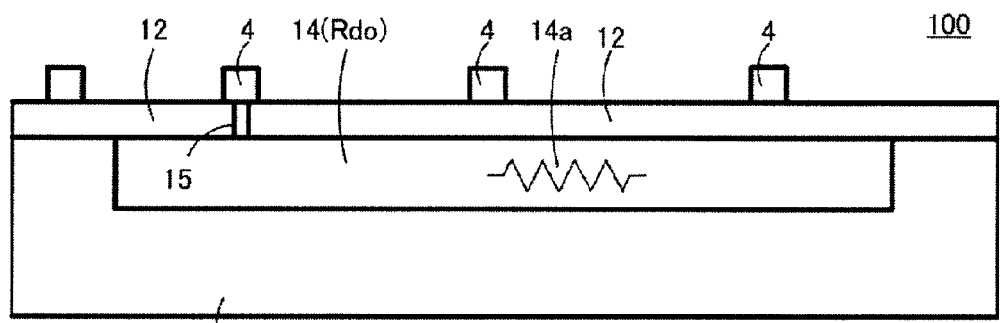
FIGS. 4A to 4D are sectional views showing the main part of the semiconductor device 100 in FIG. 3.
Figure 4B:
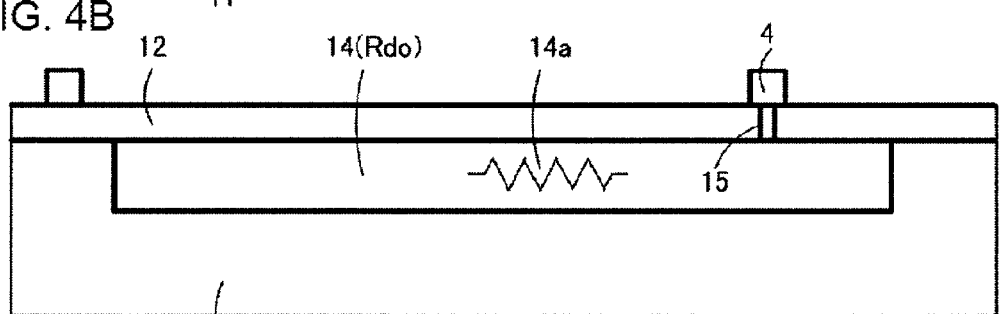
Figure 4C:
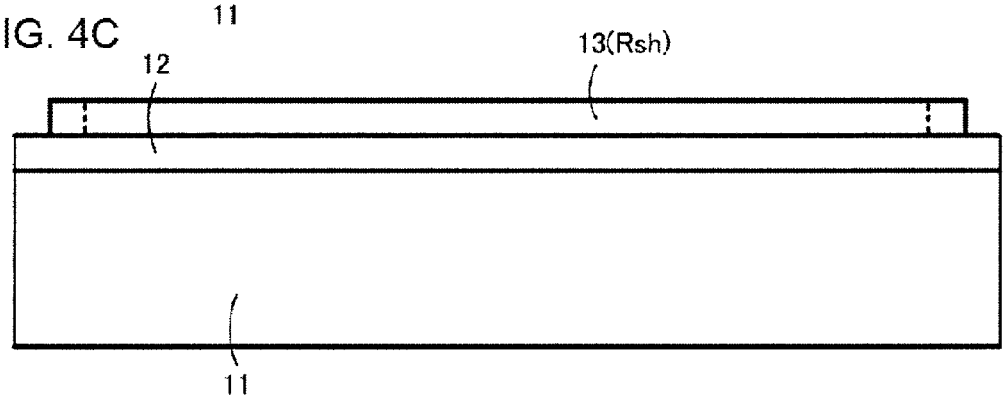
Figure 4D:
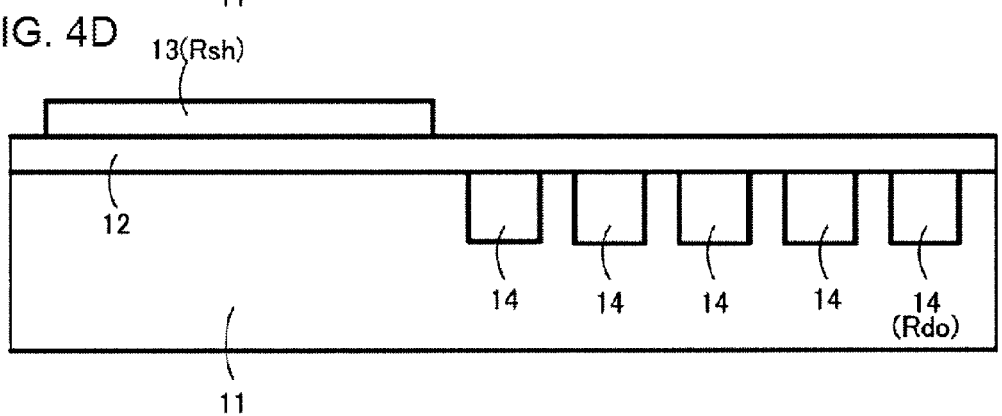

The configuration of a semiconductor device according to Embodiment 1 of the invention will be described. FIGS. 1 to 3 and FIGS. 4A to 4D are explanatory views showing the configuration of a semiconductor device 100 according to Embodiment 1 of the invention. Specifically, FIG. 1 is a circuit diagram showing the circuit configuration of a current detection circuit 101 which detects a current with high accuracy by use of a shunt resistor Rsh. FIG. 2 is an explanatory view showing the layout of the semiconductor device 100 having the current detection circuit 101. FIG. 3 is a plan view showing a main part of the semiconductor device 100 in which the shunt resistor Rsh and a voltage division ratio adjustment resistor Rdo are formed. FIGS. 4A to 4D are sectional views showing the main part of the semiconductor device 100 in FIG. 3. FIG. 4A shows a sectional view taken along the line X1-X1 in FIG. 3. FIG. 4B is a sectional view taken along the line X2-X2 in FIG. 3. FIG. 4C is a sectional view taken along the line X3-X3 in FIG. 3. FIG. 4D shows a sectional view taken along the line Y-Y in FIG. 3.

In FIG. 1 and FIG. 2, the current detection circuit 101 of the semiconductor device 100 is provided with a shunt resistor Rsh, a voltage division ratio adjustment resistor Rdo and a selection circuit 1. The selection circuit 1 is provided with enhancement type n-channel type MOSFETs 2 (hereinafter simply referred to as MOSFETs) serving as switching elements, and Zener Zaps 3 serving as trimming elements to select a voltage division ratio of the voltage division ratio adjustment resistor Rdo. Each of the MOSFETs 2 may be of a p-channel type. Bipolar transistors etc. may be used in place of the MOSFETs 2. Here, the reference sign Rsh denotes a resistive element of the shunt resistor as a whole and a resistance value thereof. In addition, the reference sign Rdo which will be described later denotes a resistive element of the voltage division ratio adjustment resistor as a whole and a resistance value thereof. Further, the reference signs Rd1, Rd2 and Rd3 denote resistive elements of voltage division resistors from a ground GND of the voltage division ratio adjustment resistor Rdo to voltage division points P1, P2 and P3 and resistance values of the resistive elements of the voltage division resistors respectively.

The shunt resistor Rsh and the voltage division ratio adjustment resistor Rdo are disposed on the same semiconductor substrate as will be described later. The shunt resistor Rsh and the voltage division ratio adjustment resistor Rdo are connected in parallel through contact holes 15a by wires 13a. Detected voltage lines 4 (4a, 4b and 4c) are connected to the voltage division points P1, P2 and P3 of the voltage division ratio adjustment resistor Rdo at their one ends and output divided voltages Vd1, Vd2 and Vd3 as the voltages of the voltage division points P1, P2 and P3 with reference to the ground GND. The detected voltage lines 4 (4a, 4b and 4c) are led out through contact holes 15. The other ends of the detection lines 4 are connected to drains D of the MOSFETs 2 (2a, 2b and 2C) constituting the selection circuit 1, respectively.

A power supply E is connected to the cathodes K of the Zener Zaps 3 (3a, 3b and 3c) constituting the selection circuit 1 so that, for example, a power supply voltage 5V can be always applied thereto. The anodes A of the Zener Zaps 3 (3a, 3b and 3c) are connected to the ground GND. In addition, trimming pads 5 (5a, 5b and 5c) are connected to the cathodes K of the Zener Zaps 3. Inverters 6 (6a, 6b and 6c) are connected between the cathodes K of the Zener Zaps 3 with the power supply E and gates G of the MOSFETs 2. Although not shown, the power supply E can be connected as a power supply for the inverters 6.

The selection circuit 1 selects one Zener Zap 3 (3a, 3b or 3c) from the Zener Zaps 3 (3a, 3b and 3c) to short-circuit the selected Zener Zap 3. When, for example, the power supply E is used as the power supply for the inverters 6, the power supply voltage 5V is applied to the gate G of the MOSFET 2 connected to the short-circuited Zener Zap 3 and the MOSFET 2 turns ON. When the MOSFET 2 is in an ON state, a detected voltage Vs is outputted from a source S of the MOSFET 2. In the completed current detection circuit 101, one Zener Zap 3 (3a, 3b or 3c) selected by the selection circuit 1 is short-circuited. To short-circuit one of the Zener Zaps 3 is called trimming.

A not-shown selection circuit (constituted by a logical circuit) which detects a variation of the resistance value of the shunt resistor Rsh and selects a desired one from the detected voltage lines 4 (4a, 4b and 4c) is mounted in the current detection circuit 101. However, description about the not-shown selection circuit will be omitted here. Although description will be made here in the case where three MOSFETs 2 (2a, 2b and 2c), three Zener Zaps 3 (3a, 3b and 3c), and three detected voltage lines 4 (4a, 4b and 4c) are disposed by way of example, the number of the MOSFETs 2, the number of the Zener Zaps 3 and the number of the detected voltage lines 4 may be increased/decreased in accordance with the number of the voltage division points of the voltage division ratio adjustment resistor Rdo.

In FIG. 3 and FIGS. 4A to 4D, the shunt resistor Rsh of the current detection circuit 101 is manufactured, for example, in such a manner that an Al—Si—Cu metal wire 13 is formed on an insulating film 12 with which the surface of an n semiconductor substrate 11 is covered. The voltage division ratio adjustment resistor Rdo is manufactured in such a manner that p-type impurities are selectively diffused in a surface layer of the n semiconductor substrate 11 surface layer of which is covered with the insulating film 12, so as to form a p diffused region 14a. The p-type impurity concentration of the p diffused region 14a is adjusted so that a diffused resistor 14 (voltage division ratio adjustment resistor Rdo) with a desired resistance value can be obtained. The diffused resistor 14 and the Al—Si—Cu metal wire 13 (shunt resistor Rsh) are connected through the contact holes 15. The contact holes 15 penetrate the insulating film 12 in a depth direction and reach the diffused resistor 14. Although not shown, the MOSFETs 2 and the Zener Zaps 3 are elements formed in the surface layer of the same n semiconductor substrate 11 as the shunt resistor Rsh and the voltage division ratio adjustment resistor Rdo.

In the Al—Si—Cu metal wire 13 serving as the shunt resistor Rsh, Si and Cu are not additives added from the viewpoint of adjustment of the resistance value but are additives added from the viewpoint of prevention of electromigration. Accordingly, when seen only from the viewpoint of the resistance value, a metal wire such as an Al wire or a Cu wire may be used as the shunt resistor Rsh in place of the Al—Si—Cu metal wire 13. Besides being used as the shunt resistor Rsh, the Al—Si—Cu metal wire 13 is used as the wires 13a connecting the shunt resistor Rsh to the voltage division ratio adjustment resistor Rdo or as simple wires 13a such as the detected voltage lines 4. Therefore, the shunt resistor Rsh, the detected voltage lines 4, and the wires 13a shown in FIG. 3 are formed simultaneously. It is a matter of course that the wires 13a may be other metal wires (Al wires, Cu wires, or the like) than the Al—Si—Cu metal wire 13. In addition, the contact holes 15 and 15a are filled with tungsten as plug electrodes. Alternatively, the contact holes 15 and 15a may be not provided with the plug electrodes but filled with the detected voltage lines 4, the wires 13a, etc.

Next, a trimming method will be described. First, trimming is performed in a chip test time etc. either at a wafer test stage after a wafer process or at a product inspection stage after molding. The trimming at the wafer test stage is performed in such a manner that a current is applied to one of the trimming pads 5 to which a corresponding one of the Zener Zaps 3 short-circuited due to the trimming is connected. The trimming at the product inspection stage is performed in such a manner that the pads 5 and external lead-out terminals protruding outward from a mold resin are connected to each other by wires in front of the mold and a current is applied to one of the pads 5 through a corresponding one of the external lead-out terminals to which the Zener Zap 3 short-circuited due to the trimming is connected. A specific method will be described below.

A voltage Vsh generated due to a current I flowing into the shunt resistor Rsh is divided through the voltage division ratio adjustment resistor Rdo, and outputted as a detected voltage Vs through the selection circuit 1 from the detected voltage line 4a connected to the voltage division point P1 at which, for example, the voltage division ratio is 0.5. When the detected voltage Vs is deviated from a target voltage (predetermined voltage), the selection circuit 1 selects one voltage division ratio at which the desired detected voltage Vs can be obtained, and selects a corresponding one of the detected voltage lines 4 (4a, 4b or 4c) which provides the selected voltage division ratio. The method for selecting one voltage division ratio will be described later. The selected Zener Zap 3 is short-circuited, and 5 V is applied to the gate G of the corresponding MOSFET 2 connected to the Zener Zap 3, so as to turn ON the MOSFET. In this manner, trimming is performed. The ON state and the OFF state of the MOSFET 2 can be controlled in accordance with a gate signal (digital signal) of the MOSFET 2. Accordingly, even a Zener Zap 3 with a large resistance component can be used as a trimming element.

In this embodiment, when the voltage is divided by the voltage division ratio adjustment resistor Rdo having a high resistance value, the voltage division ratio can be adjusted more finely than when the voltage is directly divided by the shunt resistor Rsh having low resistance. The voltage division ratio adjustment resistor Rdo may be formed to have the same resistivity in the whole region (single resistance type). Alternatively, regions having different resistivities may be provided in the voltage division ratio adjustment resistor Rdo (double resistance type) so that the voltage division ratio can be finely adjusted in the vicinity of the target detected voltage (for example, voltage in the center of the voltage division ratio adjustment resistor Rdo).

Figure 5:
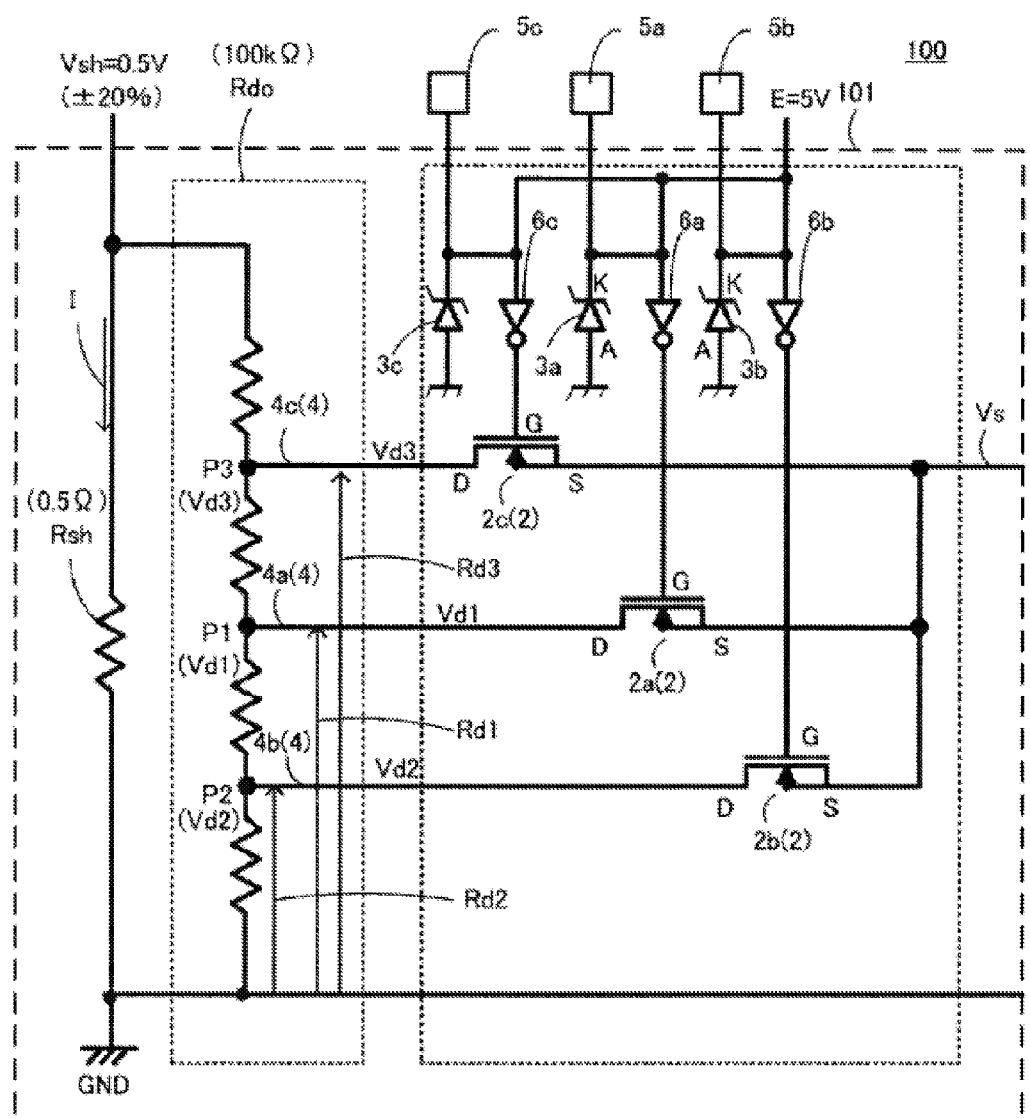
FIG. 5 is an explanatory view showing a method for adjusting a voltage division ratio when the resistance value of the shunt resistor Rsh varies.

FIG. 5 is an explanatory view showing the method for adjusting the voltage division ratio when there is a variation in the resistance value of the shunt resistor Rsh. Here, assume that the resistance value of the shunt resistor Rsh is set at 0.5Ω and the variation thereof is ±20%. The resistance value of the shunt resistor Rsh varies in the range of from 0.4Ω to 0.6Ω around 0.5Ω. Even when the resistance value of the shunt resistor Rsh varies in this manner, a voltage division ratio of the voltage division ratio adjustment resistor Rdo can be selected to prevent variation of the detected voltage Vs from which the current I flowing into the shunt resistor Rsh can be detected. Description will be made below in the case where, for example, the resistance value of the voltage division ratio adjustment resistor Rdo is 100 kΩ. As the resistance value of the voltage division ratio adjustment resistor Rdo increases, power consumption decreases preferably.

When the resistance value of the shunt resistor Rsh is 0.5Ω (an average value of the variation), for example, the resistance value of the voltage division resistor Rd1 is set at a central value (50 kΩ) of the voltage division ratio adjustment resistor Rdo. The selection circuit 1 selects the detected voltage line 4a connected to the voltage division point P1 when the point of 50 kΩ is set at the voltage division point P1 (the voltage division ratio is 0.5). The detected voltage line 4a is led out from the center of the voltage division ratio adjustment resistor Rdo when the resistivity is uniform. The selection circuit 1 selects the detected voltage line 4b connected to a point at which the resistance value of the voltage division resistor Rd2 is 42 kΩ (the voltage division ratio at the voltage division point P2 is 0.42) when the resistance value of the shunt resistor Rsh is 0.6Ω (the maximum value of the variation). The selection circuit 1 selects the detected voltage line 4c connected to a point at which the resistance value of the voltage division resistor Rd3 is 62 kΩ (the voltage division ratio at the voltage division point P3 is 0.62) when the resistance value of the shunt resistor Rsh is 0.4Ω (the minimum value of the variation).

As described above, the voltage division resistors Rd1, Rd2 and Rd3 are 0.5, 0.42 and 0.62 when expressed based on the voltage division ratios S of the voltage division ratio adjustment resistor Rdo. In addition, the selection circuit 1 selects one from the detected voltage lines 4 (4a, 4b and 4c) connected to the voltage division ratios (0.5, 0.42 and 0.62) of the voltage division ratio adjustment resistor Rdo corresponding to the average value, the maximum value and the minimum value of the variation of the resistance value of the shunt resistor Rsh respectively. Specific description will be further given here.

Description will be made in the case where, for example, a current of 1 A flows into the shunt resistor Rsh. The voltage generated in the shunt resistor Rsh is 0.5 V when the resistance value of the shunt resistor Rsh is 0.5Ω. This voltage of 0.5 V is applied to the voltage division ratio adjustment resistor Rdo (100 kΩ). Since the resistance value of the voltage division resistor Rd1 is 50 kΩ, a divided voltage Vd1 at the voltage division point P1 becomes 0.5 V×(50 kΩ/100 kΩ)=0.25 V. Since the detected voltage line 4a is connected to the voltage division point P1, the divided voltage Vd1 of 0.25 V is outputted as the detected voltage Vs from the source S of the MOSFET 2a connected to the detected voltage line 4a.

Next, the voltage generated in the shunt resistor Rsh is 0.6 V when the resistance value of the shunt resistor Rsh is 0.6 kΩ (the maximum value of the variation). This voltage of 0.6 V is applied to the voltage division ratio adjustment resistor Rdo (100 kΩ). Since the voltage division resistor Rd2 is 42 kΩ, a divided voltage Vd2 at the voltage division point P2 becomes 0.6 V×(42 kΩ/100 kΩ)=0.25 V (which is strictly 0.252 V). Since the detected voltage line 4b is connected to the voltage division point P2, the divided voltage Vd2 of 0.25 V is outputted as the detected voltage Vs from the source S of the MOSFET 2b connected to the detected voltage line 4b.

Next, the voltage generated in the shunt resistor Rsh is 0.4 V when the resistance value of the shunt resistor Rsh is 0.4 S2 (the minimum value of the variation). This voltage of 0.4 V is applied to the voltage division ratio adjustment resistor Rdo (100 kΩ). Since the voltage division resistor Rd3 is 62 kΩ, a divided voltage Vd3 at the voltage division point P3 becomes 0.4 V×(62 kΩ/100 kΩ)=0.25 V (which is strictly 0.248 V). Since the detected voltage line 4c is connected to the voltage division point P3, the divided voltage Vd3 of 0.25 V is outputted as the detected voltage Vs from the source S of the MOSFET 2c connected to the detected voltage line 4c.

That is, when the resistance value of the shunt resistor Rsh is 0.5Ω, the selection circuit 1 connects the detected voltage line 4a to the voltage division point P1 at which the resistance value of the voltage division resistor Rd1 is 50 kΩ. When the resistance value of the shunt resistor Rsh is 0.6Ω (the maximum value of the variation), the selection circuit 1 connects the detected voltage line 4b to the voltage division point P2 at which the resistance value of the voltage division resistor Rd2 is 42 kΩ. When the resistance value of the shunt resistor Rsh is 0.4Ω (the minimum value of the variation), the selection circuit 1 connects the detected voltage line 4c to the voltage division point P3 at which the resistance value of the voltage division resistor Rd3 is 62 kΩ. In this manner, even when the resistance value of the shunt resistor Rsh varies to be any of 0.4Ω, 0.5Ω and 0.6Ω, one divided voltage (Vd1=Vd2=Vd3=0.25 V) in which the variation can be substantially cancelled is outputted as the detected voltage Vs from the detected voltage lines 4 (strictly, almost the same voltage is outputted). When expressed based on the relation between the shunt resistor Rsh and the voltage division ratio S, the products Rsh×S are all 0.25Ω (strictly substantially 0.25Ω) because the voltage division ratio S is 0.5 when the resistance value of the shunt resistor Rsh is 0.5Ω, the voltage division ratio S is 0.42 when the resistance value of the shunt resistor Rsh is 0.6Ω and the voltage division ratio S is 0.62 when the resistance value of the shunt resistor Rsh is 0.4Ω.

Incidentally, it is necessary to determine a central value (average value) So (0.5 in this case) of the voltage division ratio S within a range in which the voltage division ratio S (0.62 in this case) of the voltage division ratio adjustment resistor Rdo corresponding to the minimum value of the variation of the resistance value of the shunt resistor Rsh is not higher than 1.

Figure 6A:
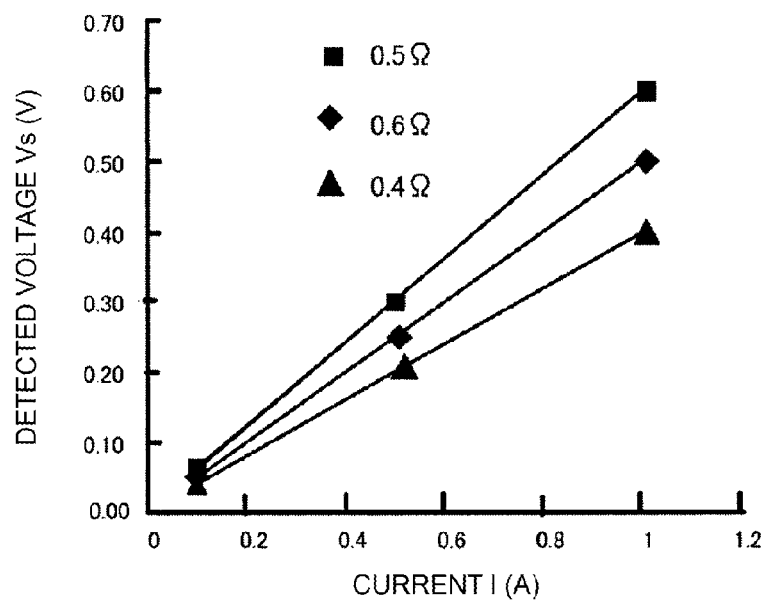
FIGS. 6A and 6B are characteristic graphs showing the relation between a detected voltage Vs and a current I flowing into the shunt resistor Rsh.
Figure 6B:
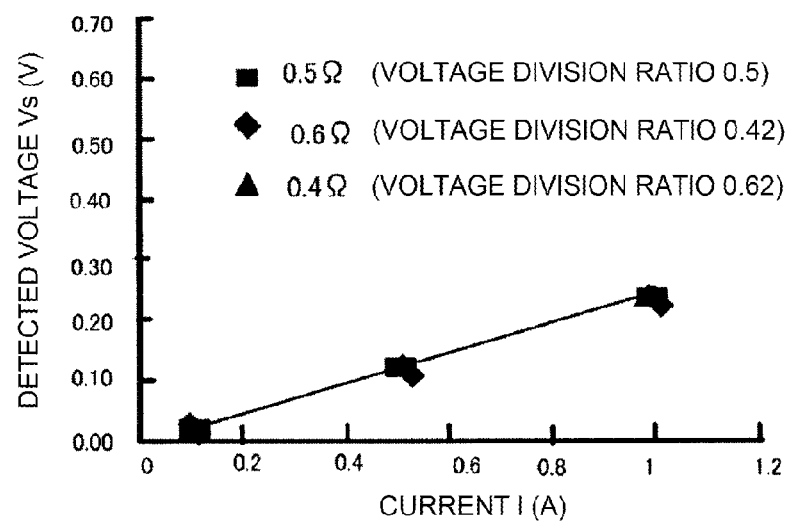

FIGS. 6A and 6B are characteristic graphs showing the relation between the detected voltage Vs and the current I flowing into the shunt resistor Rsh. FIG. 6A shows the case without trimming. FIG. 6B shows the case with trimming. FIGS. 6A and 6B are shown in the case where the minimum value, the average value and the maximum value of the variation of the resistance value of the shunt resistor Rsh are 0.4Ω, 0.5Ω and 0.6Ω respectively.

From the results of FIGS. 6A and 6B, the voltage division ratio of the voltage division ratio adjustment resistor Rdo can be adjusted by trimming so that the variation of the resistance value of the shunt resistor Rsh does not affect the detected voltage Vs, and hence the detected voltage Vs does not change. That is, the current I flowing into the shunt resistor Rsh can be measured accurately even when the resistance value of the shunt resistor Rsh varies.

However, the detected voltage Vs varies when the resistance value of the shunt resistor Rsh is any other intermediate value than the average value (0.5Ω), the maximum value (0.6Ω) and the minimum value (0.4Ω) of the variation with respect to the ground GND. Assume that when, for example, the resistance value of the shunt resistor Rsh is between the average value (0.5Ω) and the maximum value (0.6Ω), the selection circuit 1 selects one from the detected voltage lines 4 based on an intermediate value (0.55Ω) between the average value (0.5Ω) and the maximum value (0.6Ω). Specifically, the selection circuit 1 selects the detected voltage line 4a when the resistance value of the shunt resistor Rsh is between the average value (0.5Ω) and the intermediate value (0.55Ω) and selects the detected voltage line 4b when the resistance value of the shunt resistor Rsh is between the intermediate value (0.55Ω) and the maximum value (0.6Ω). Moreover, assume that when the resistance value of the shunt resistor Rsh is between the average value (0.5Ω) and the minimum value (0.4Ω), the selection circuit 1 selects one from the detected voltage lines 4 based on an intermediate value (0.45Ω) between the average value (0.5Ω) and the minimum value (0.4Ω). Specifically, the selection circuit 1 selects the detected voltage line 4a when the resistance value of the shunt resistor Rsh is between the average value (0.5Ω) and the intermediate value (0.45Ω) and selects the detected voltage line 4c when the resistance value of the shunt resistor Rsh is between the intermediate value (0.45Ω) and the minimum value (0.4Ω). In this configuration, the detected voltage Vs varies and the resistance value of the shunt resistor Rsh varies largely in the vicinity of the intermediate value (0.55Ω or 0.45Ω) when the resistance value of the shunt resistor Rsh is any other intermediate value than the average value (0.5Ω), the maximum value (0.6Ω) and the minimum value (0.4Ω).

Therefore, it is necessary to finely divide regions of the voltage division ratio adjustment resistor Rdo between the average value of 50 kΩ and the maximum value of 62 kΩ and between the average value of 50 kΩ and the minimum value of 42 kΩ and finely divide the voltage division ratio in order to reduce the variation of the detected voltage Vs.

When, for example, each of the regions of the voltage division ratio adjustment resistor Rdo between the average value of 50 kΩ and the maximum value of 62 kΩ and between the average value of 50 kΩ and the minimum value of 42 kΩ is finely divided into twenty points, the variation of the detected voltage Vs is reduced to ¹/₄₀. As a result, the current I flowing into the shunt resistor Rsh can be measured accurately even when the resistance value of the shunt resistor Rsh varies.

In addition, when the voltage division ratio adjustment resistor Rdo is divided into a large number of points as described above, it is necessary to increase the number of detected voltage lines 4 correspondingly. Then, it is also necessary to increase the number of contact holes 15 as connection places between the voltage division ratio adjustment resistor Rdo and the detected voltage lines 4, and to thereby increase the area occupied by the contact holes 15 as the connection places. For this reason, the resistivity between the voltage division point P2 and the voltage division point P3 may be made lower than any other point so that the region between the voltage division point P2 and the voltage division point P3 can be made longer (wider). In that case, the voltage division resistors Rd1, Rd2 and Rd3 are not of the single resistance type with uniform resistivity but of a double resistance type partially with different resistivity.

In addition, although the voltage division ratio of the voltage division ratio adjustment resistor Rdo corresponding to the average value of the variation of the resistance value of the shunt resistor Rsh is 0.5 here, the voltage division ratio is not limited thereto. When the voltage division ratio is larger than 0.5, the detected voltage Vs can be increased to enhance the detection accuracy. However, when the voltage division ratio is close to 1, the width of the divided voltage which can be adjusted becomes so narrow that it is necessary to limit the variation of the resistance value of the shunt resistor Rsh to be small.

The accuracy of the detected voltage Vs can be improved when trimming is performed by the Zener Zaps 3 in a chip test time in product inspection after wire bonding, in comparison with that when the trimming is performed before wire bonding. The reason is as follows. When trimming is performed before wire bonding, for example, resistance of the bonding wire may adversely affect the shunt resistor Rsh after the wire bonding which is performed after the trimming. Thus, the accuracy of the detected voltage Vs may be lowered. The chip test in production inspection is a test after wire bonding so that the accuracy of the detected voltage Vs can be improved in comparison with the test performed before wire bonding. Therefore, trimming which needs to be performed before wire bonding, for example, trimming which is performed by a laser cannot be used.

Figure 7:
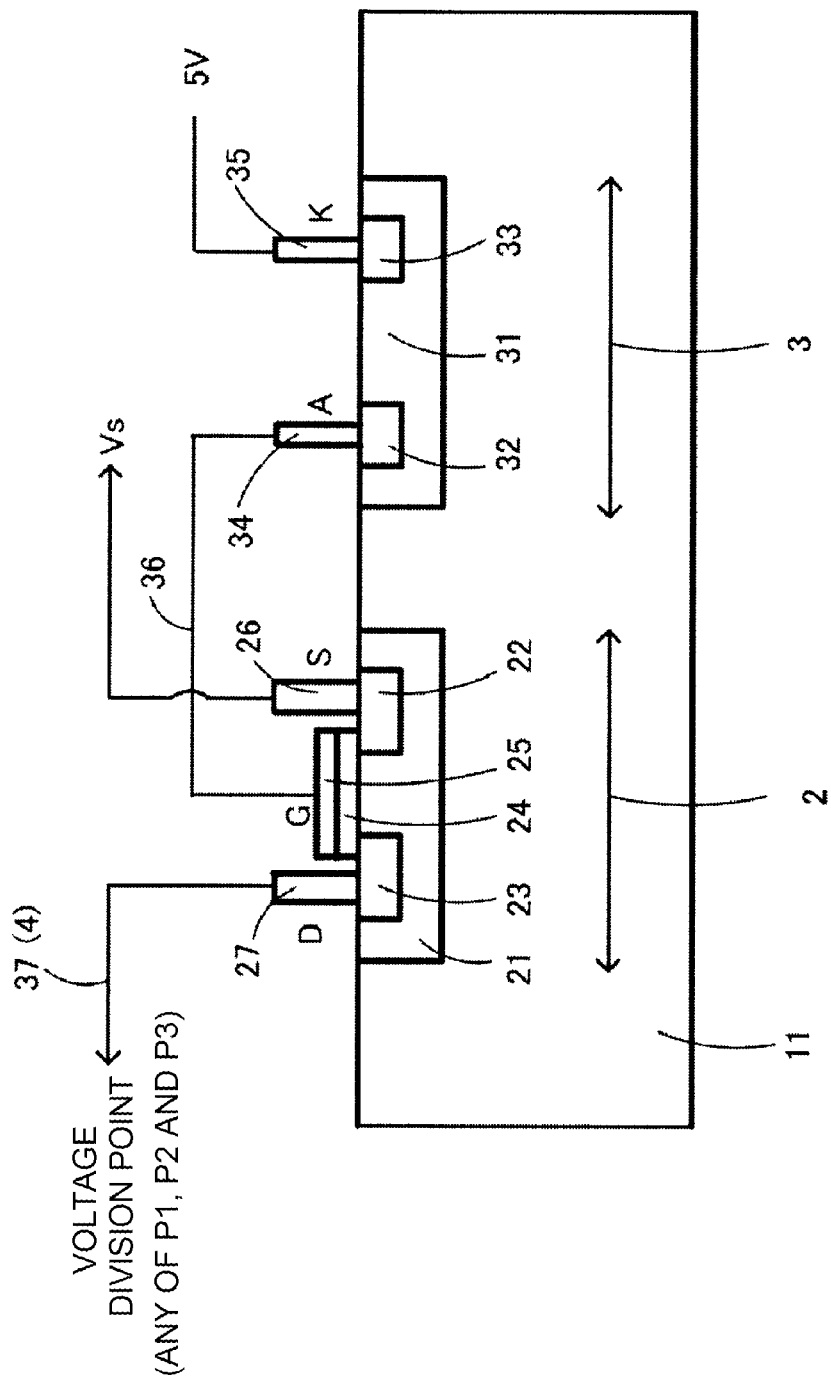
FIG. 7 is a sectional view showing a main part corresponding to an MOSFET 2 and a Zener Zap 3.

FIG. 7 is a sectional view showing a main part corresponding to the MOSFET 2 and the Zener Zap 3. The MOSFET 2 is of a lateral type. In the MOSFET 2, a p-well region 21 is formed in a surface layer of an n semiconductor substrate 11 and an n source region 22 and an n drain region 23 are selectively formed in the surface layer of the p-well region 21. A gate electrode 25 is formed, through a gate insulating film 24, on the p-well region 21 interposed between the n source region 22 and the n drain region 23. In addition, a source electrode 26 and a drain electrode 27 are formed to be electrically connected to the n source region 22 and the n drain region 23 respectively.

The Zener Zap 3 is of a lateral type. In the Zener Zap 3, a p-well region 31 is formed in the surface layer of the n semiconductor substrate 11 and a p anode region 32 and an n cathode region 33 are selectively formed in the surface layer of the p-well region 31. In addition, an anode electrode 34 and a cathode electrode 35 are formed to be electrically connected to the p anode region 32 and the n cathode region 33 respectively. The gate G (gate electrode 25) of the MOSFET 2 and the anode A (anode electrode 34) of the Zener Zap 3 are connected through a wire 36. Moreover, the drain D (drain electrode 27) of the MOSFET 2 and any of the voltage division points P1, P2 and P3 of the voltage division ratio adjustment resistor Rdo are connected through a wire 37 (this wire 37 serves as the detected voltage line 4). A detected voltage Vs is outputted from the source S (source electrode 26) of the MOSFET 2.

In addition, for example, 5 V is always applied to the cathode K (cathode electrode 35) of the Zener Zap 3. In this state, the Zener Zap 3 is in a reverse-blocking state but 5 V cannot be applied to the gate G (gate electrode 25) of the MOSFET 2. When, for example, a large reverse voltage is applied between the anode A (p anode region 32) and the cathode K (n cathode region 33) of the Zener Zap 3 to break down the Zener Zap 3, the Zener Zap 3 is short-circuited. When the Zener Zap 3 is short-circuited, 5 V is applied to the gate G (gate electrode 25) of the MOSFET 2, the MOSFET 2 turns ON, and the voltage (divided voltage) of the detected voltage line 4 to which the MOSFET 2 is connected is extracted as the detected voltage Vs.

Figure 8:
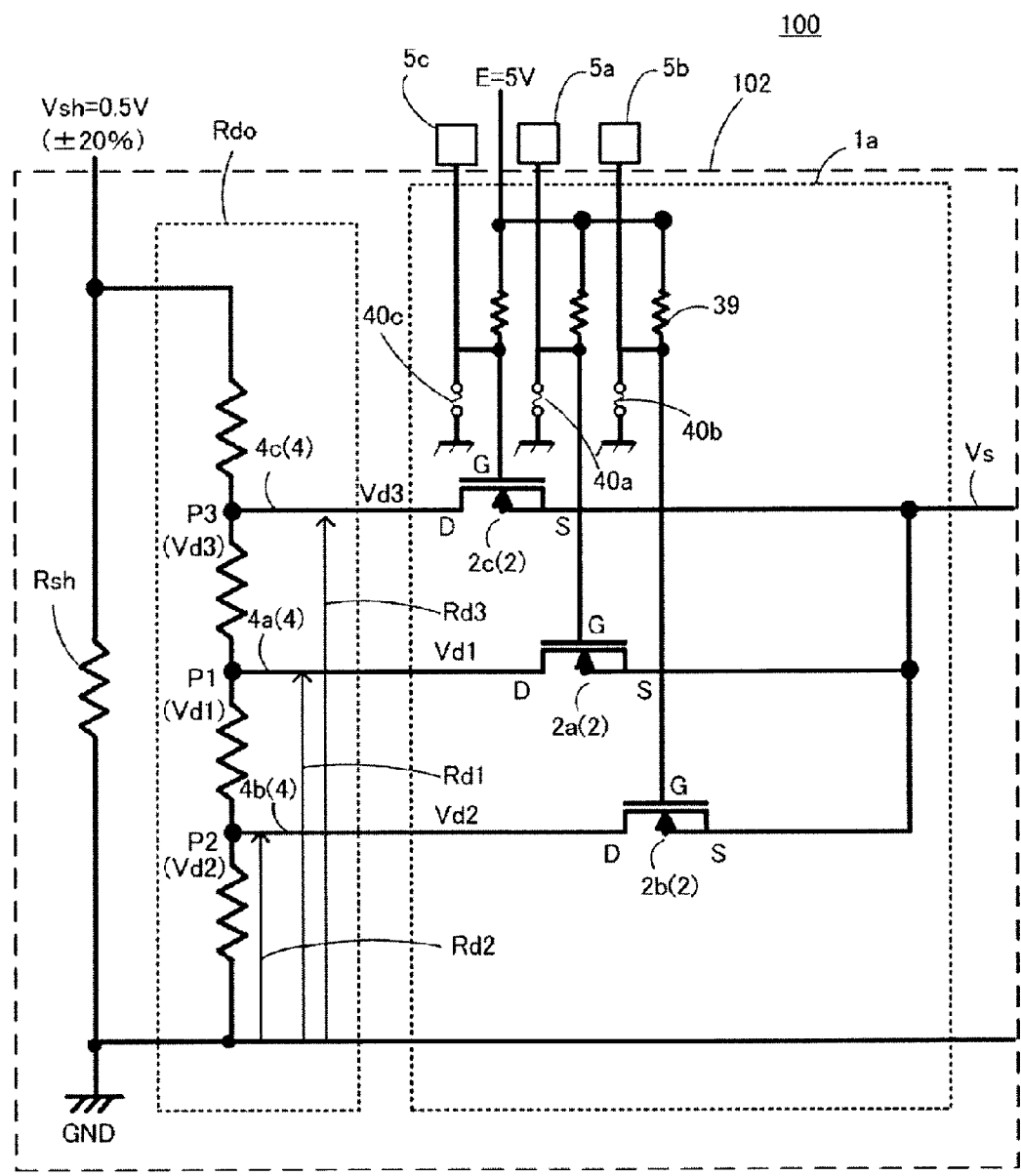
FIG. 8 is a circuit diagram showing the circuit configuration of a current detection circuit 102 using fuses 40 as trimming elements.

Next, the configuration of another example of the semiconductor device 100 according to Embodiment 1 will be described. FIG. 8 is a circuit diagram showing the circuit configuration of a current detection circuit 102 which uses fuses 40 as trimming elements. A selection circuit 1a of the current detection circuit 102 is constituted by resistors 39, the fuses 40, and MOSFETs 2. That is, the other example of the semiconductor device 100 in Embodiment 1 shown in FIG. 8 is different from the semiconductor device 100 in Embodiment 1 shown in FIG. 1 in the point that the fuses 40 which are, for example, made of polysilicon are used as trimming elements in place of the Zener Zaps.

The fuses 40 (40a, 40b and 40c) are connected between pads 5a, 5b and 5c and the ground GND respectively. The gates G of the MOSFETs 2 (2a, 2b and 2c) are connected to a power supply E through the resistors 39 respectively. In addition, the gates G of the MOSFETs 2 (2a, 2b and 2c) are connected to the ground GND through the fuses 40 (40a, 40b and 40c) respectively. In the other example of the semiconductor device 100 in Embodiment 1 shown in FIG. 8, to blow out one of the fuses 40 (40a, 40b and 40c) is referred to as trimming. The fuse 40 is blown out by a current flowing into a corresponding one of the pads 5.

Before one of the fuses 40 (40a, 40b and 40c) is blown out, the gates G of the MOSFETs 2 (2a, 2b and 2c) have the ground potential (the potential of the ground GND) and the MOSFETs 2 are in an OFF state. When one of the fuses 40 is blown out, the power supply voltage of 5V is applied to the gate G of a corresponding one of the MOSFETs 2 and the MOSFET 2 turns ON. The voltage (divided voltage) of the detected voltage line 4 to which the MOSFT 2 in an ON state is connected is extracted as a detected voltage Vs.

Figure 9A:
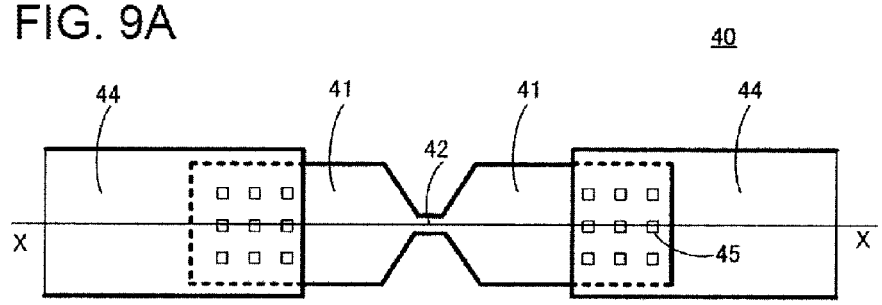
FIGS. 9A and 9B are explanatory views showing the configuration of the fuse 40 used as a trimming element.
Figure 9B:
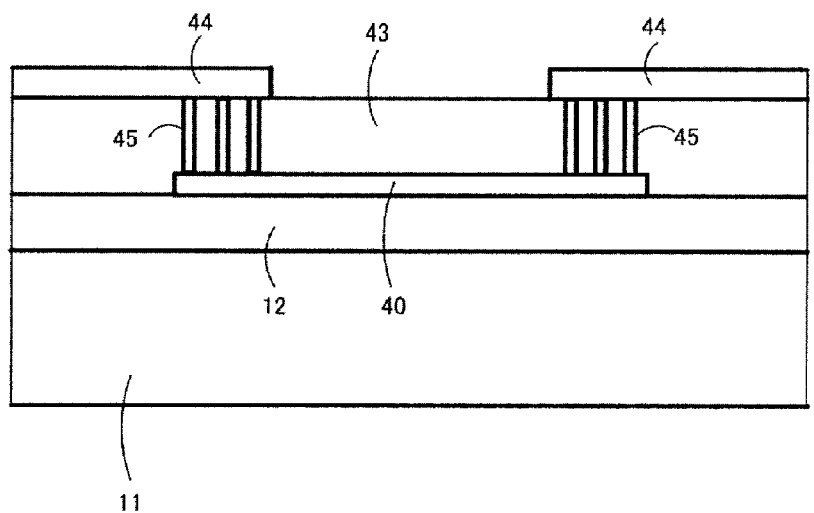

FIGS. 9A and 9B are explanatory views showing the configuration of the fuse 40 used as a trimming element. FIG. 9A is a plan view of a main part. FIG. 9B is a sectional view of the main part taken along the line X-X in FIG. 9A. The fuse 40 is formed on an insulating film 12 covering the surface of an n semiconductor substrate 11. An insulating film 43 is formed on the fuse 40. Contact holes 45 are formed to penetrate the insulating film 43 in a depth direction and reach the fuse 40. Wires 44 are formed on the insulating film 43. Electrode portions 41 of the fuse 40 and the wires 44 are connected through the contact holes 45. When a current is applied to the fuse 40 through the wires 44, a narrow portion 42 of the fuse 40 is blown out.

Embodiment 2

Figure 10A:
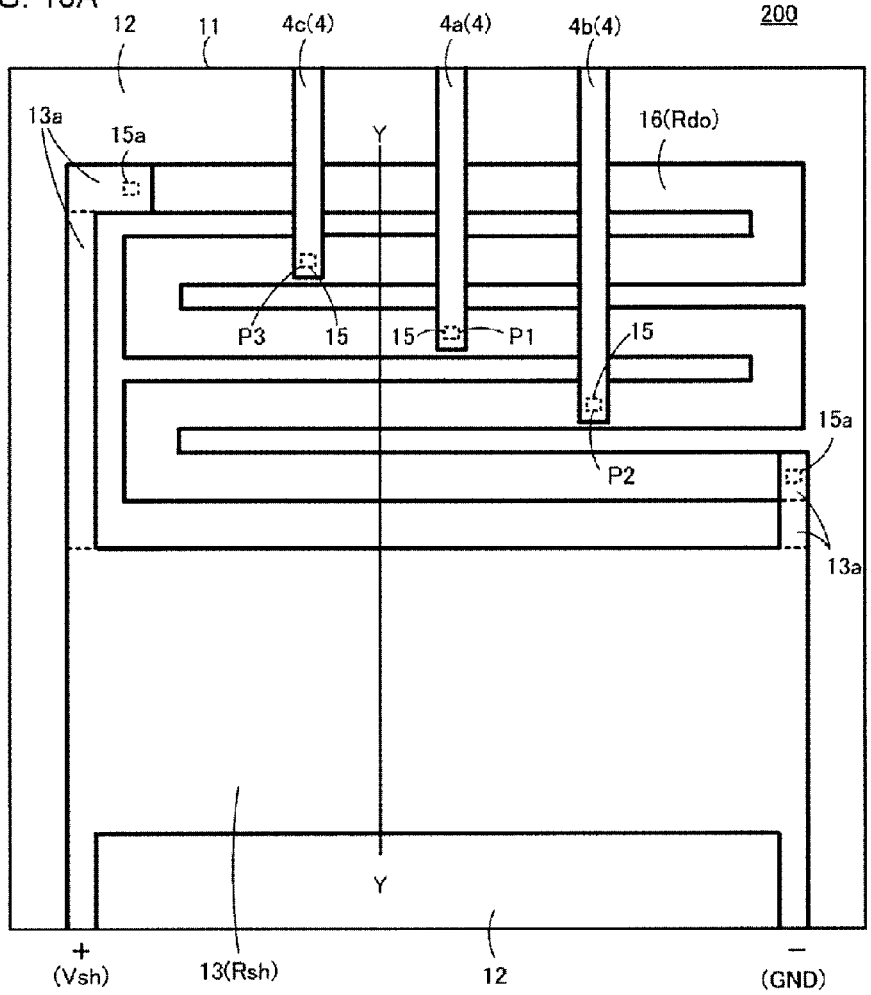
FIGS. 10A and 10B are explanatory views showing the configuration of a main part of a semiconductor device 200 according to Embodiment 2 of the invention.
Figure 10B:
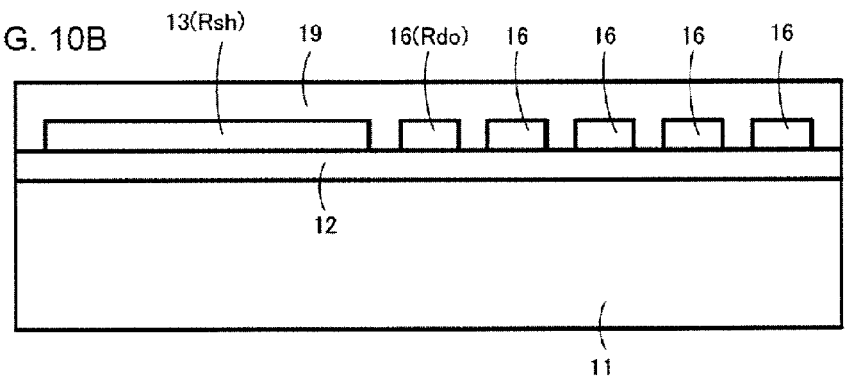

Next, the configuration of a semiconductor device according to Embodiment 2 of the invention will be described. FIGS. 10A and 10B are explanatory views showing the configuration of a main part of a semiconductor device 200 according to Embodiment 2 of the invention. FIG. 10A is a main part plan view showing a shunt resistor Rsh and a voltage division ratio adjustment resistor Rdo. FIG. 10B is a main part sectional view taken along the line Y-Y in FIG. 10A. These FIGS. 10A and 10B are explanatory views showing a modification corresponding to FIGS. 3 and 4D of Embodiment 1 respectively.

The semiconductor device 200 according to Embodiment 2 is different from the semiconductor device 100 according to Embodiment 1 in the point that the voltage division ratio adjustment resistor Rdo is formed as a polysilicon resistor 16. This polysilicon resistor 16 is formed on an insulating film 12. Detected voltage lines 4 (4a, 4b and 4c) are formed on an insulating film 19 laminated on the insulating film 12, and connected to the polysilicon resistor 16 through contact holes 15.

Embodiment 3

Next, the configuration of a semiconductor device according to Embodiment 3 of the invention will be described.

Figure 11A:
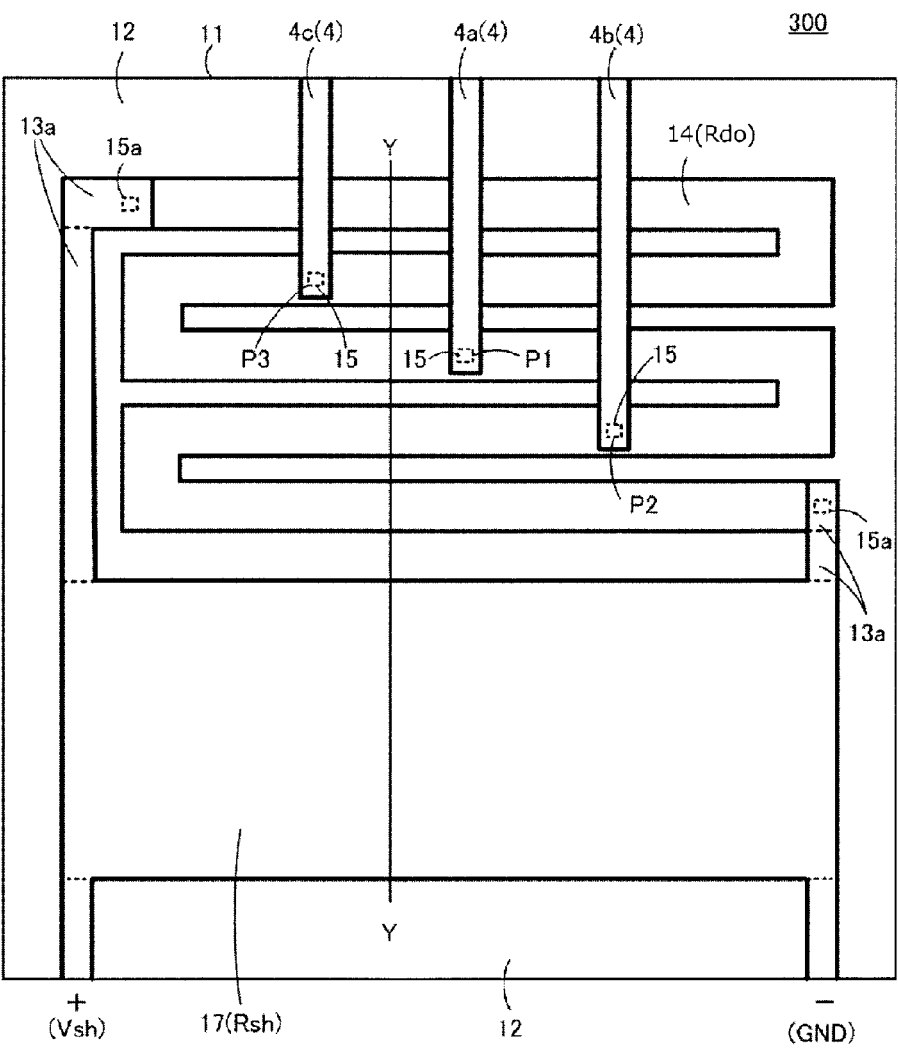
FIGS. 11A and 11B are explanatory views showing the configuration of a main part of a semiconductor device 300 according to Embodiment 3 of the invention.
Figure 11B:
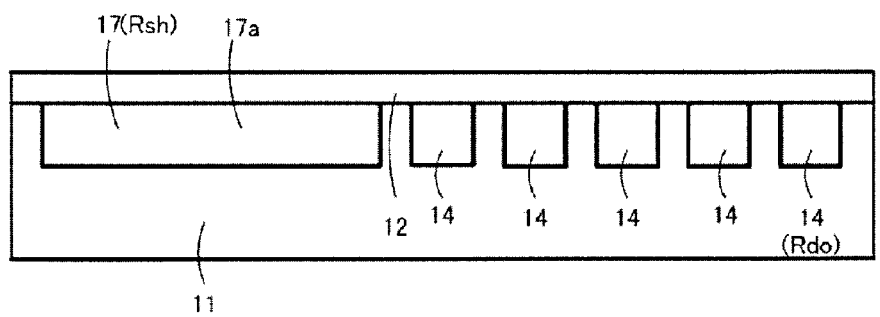

FIGS. 11A and 11B are explanatory views showing the configuration of a main part of a semiconductor device 300 according to Embodiment 3 of the invention. FIG. 11A is a main part plan view showing a shunt resistor Rsh and a voltage division ratio adjustment resistor Rdo. FIG. 11B is a main part sectional view taken along the line Y-Y in FIG. 11A. These FIGS. 11A and 11B show a modification corresponding to FIGS. 3 and 4D of Embodiment 1 respectively.

The semiconductor device 300 according to Embodiment 3 is different from the semiconductor device 100 according to Embodiment 1 in the point that the shunt resistor Rsh is formed as a diffused resistor 17. The diffused resistor 17 is a p diffused region 17a formed in a surface layer of an n semiconductor substrate 11. The surface of the p diffused region 17a is covered with an insulating film 12. The diffused resistor 17 is connected to a diffused resistor 14 (voltage division ratio adjustment resistor Rdo) by wires 13a through contact holes (not shown). The contact holes are formed to penetrate the insulating film 12 in a depth direction and reach the p diffused region 17a.

Embodiment 4

Figure 12A:
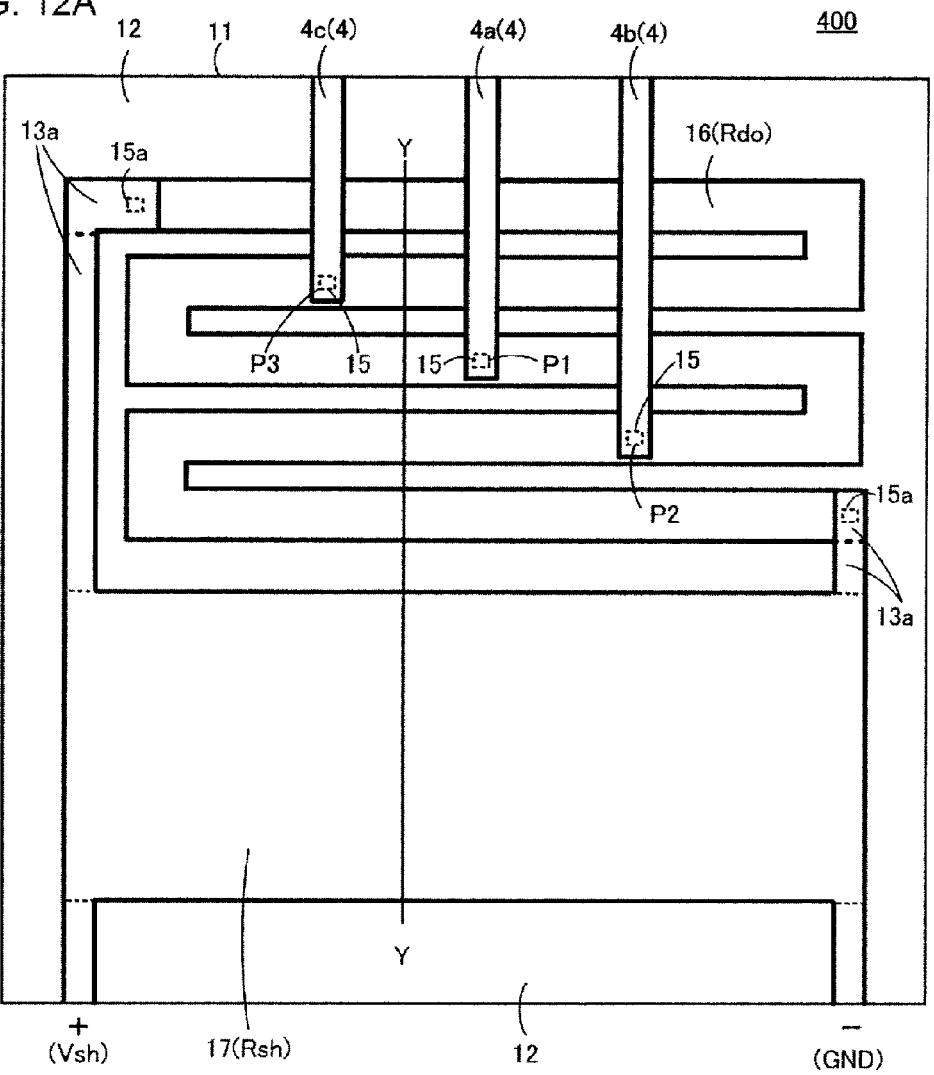
FIGS. 12A and 12B are explanatory views showing the configuration of a main part of a semiconductor device 400 according to Embodiment 4 of the invention.
Figure 12B:
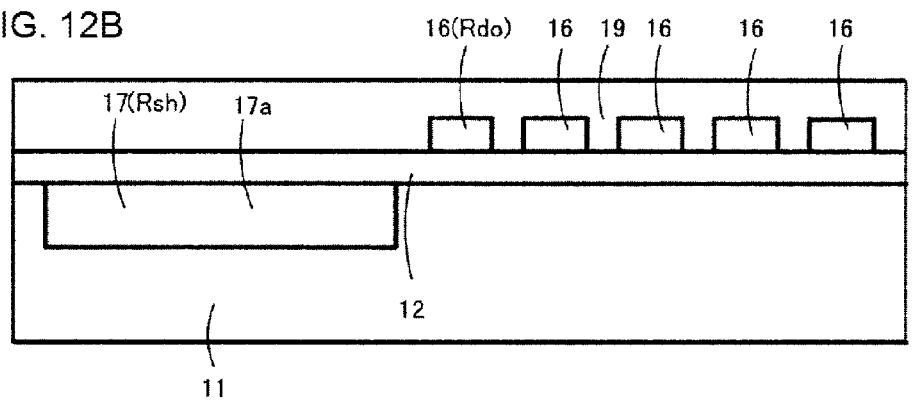

Next, the configuration of a semiconductor device according to Embodiment 4 of the invention will be described. FIGS. 12A and 12B are explanatory views showing the configuration of a main part of a semiconductor device 400 according to Embodiment 4 of the invention. FIG. 12A is a main part plan view showing a shunt resistor Rsh and a voltage division ratio adjustment resistor Rdo. FIG. 12B is a main part sectional view taken along the line Y-Y in FIG. 12A. These FIGS. 12A and 12B show a modification corresponding to FIGS. 3 and 4D of Embodiment 1 respectively.

The semiconductor device 400 according to Embodiment 4 is different from the semiconductor device 100 according to Embodiment 1 in the point that the shunt resistor Rsh is formed as a diffused resistor 17 and the voltage division ratio adjustment resistor Rdo is formed as a polysilicon resistor 16. The configuration of the diffused resistor 17 is the same as that in Embodiment 3. The configuration of the polysilicon resistor 16 is the same as that in Embodiment 2.

Embodiment 5

Figure 13A:
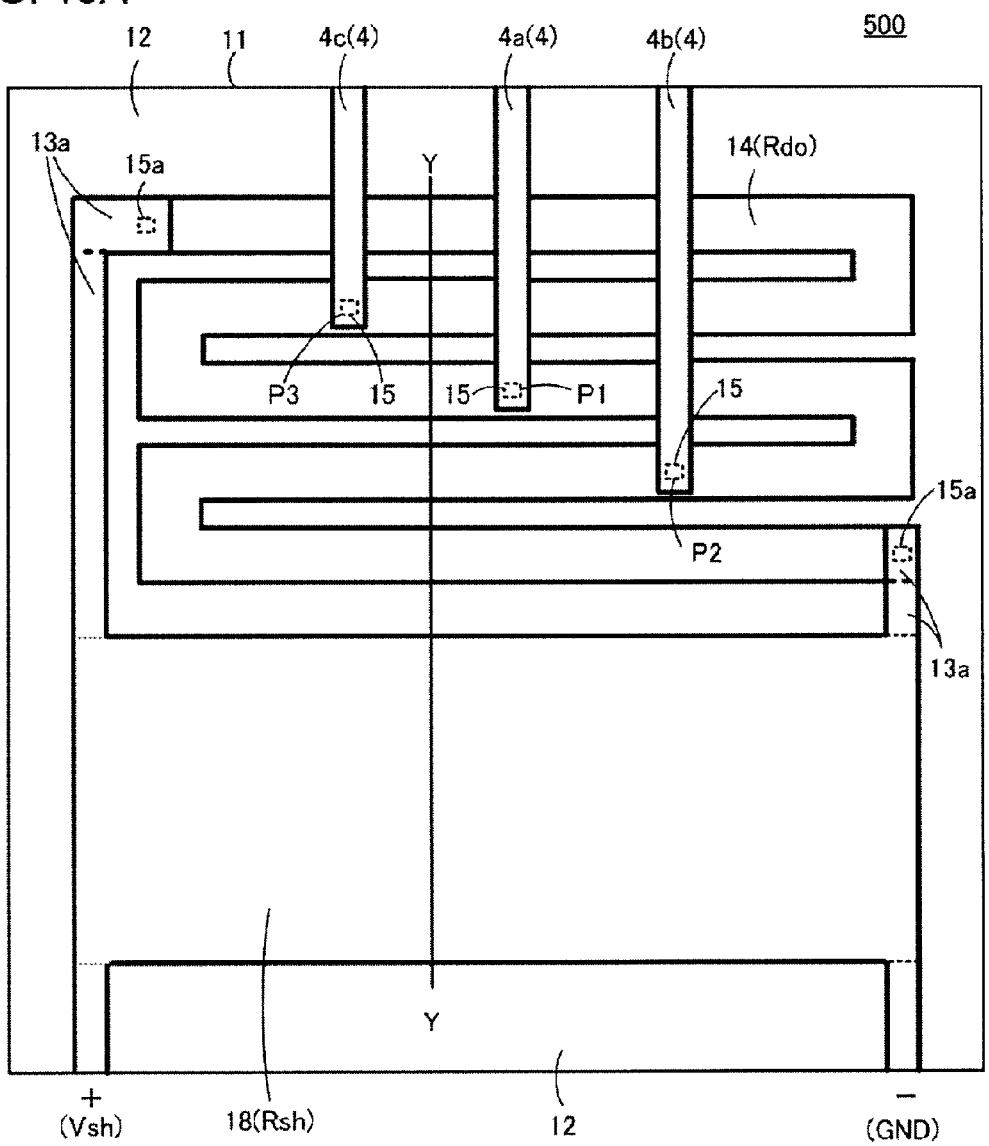
FIGS. 13A and 13B are explanatory views showing the configuration of a main part of a semiconductor device 500 according to Embodiment 5 of the invention.
Figure 13B:
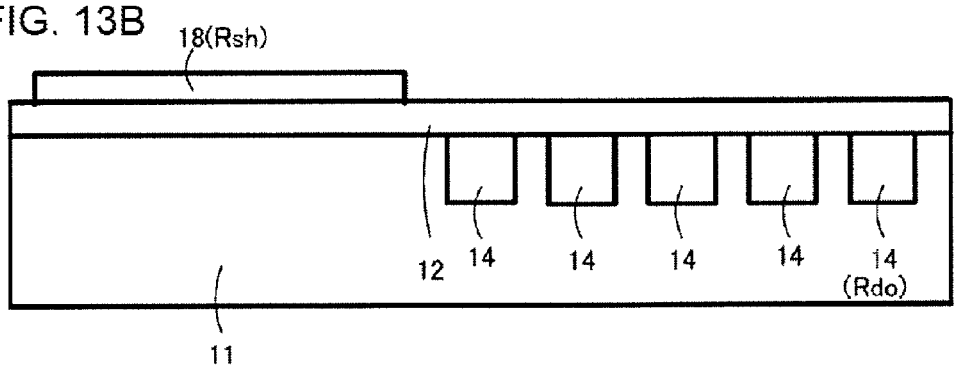

Next, the configuration of a semiconductor device according to Embodiment 5 of the invention will be described. FIGS. 13A and 13B are explanatory views showing the configuration of a main part of a semiconductor device 500 according to Embodiment 5 of the invention. FIG. 13A is a main part plan view showing a shunt resistor Rsh and a voltage division ratio adjustment resistor Rdo. FIG. 13B is a main part sectional view taken along the line Y-Y in FIG. 13A. These FIGS. 13A and 13B show a modification corresponding to FIGS. 3 and 4D of Embodiment 1 respectively.

The semiconductor device 500 according to Embodiment 5 is different from the semiconductor device 100 according to Embodiment 1 in the point that the shunt resistor Rsh is formed as a low-resistance polysilicon resistor 18. The polysilicon resistor 18 is formed on an insulating film 12, and connected to a diffused resistor 14 (voltage division ratio adjustment resistor Rdo) through contact holes 15a. The contact holes 15a penetrate the insulating film 12 in a depth direction and reach the diffused resistor 14.

Embodiment 6

Next, the configuration of a semiconductor device according to Embodiment 6 of the invention will be described.

Figure 14A:
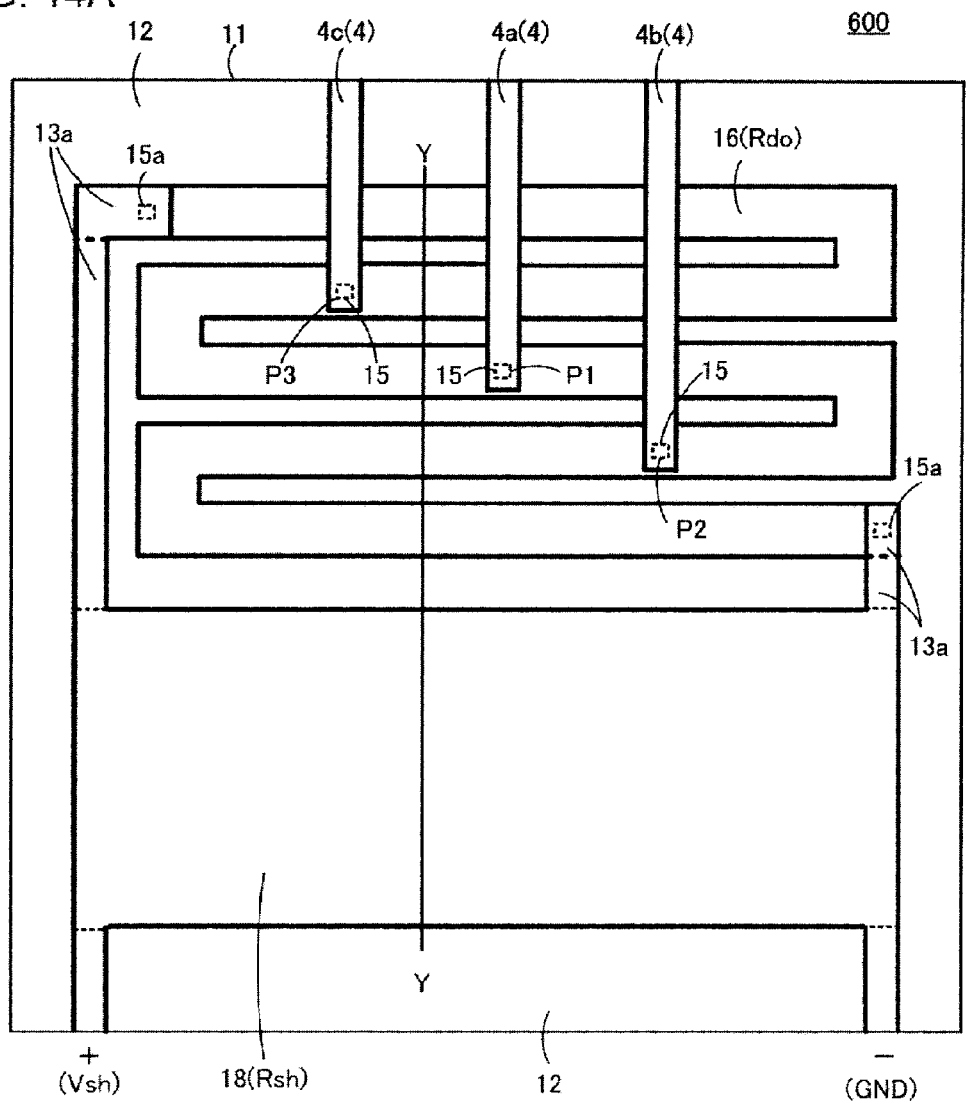
FIGS. 14A and 14B are explanatory views showing the configuration of a main part of a semiconductor device 600 according to Embodiment 6 of the invention.
Figure 14B:
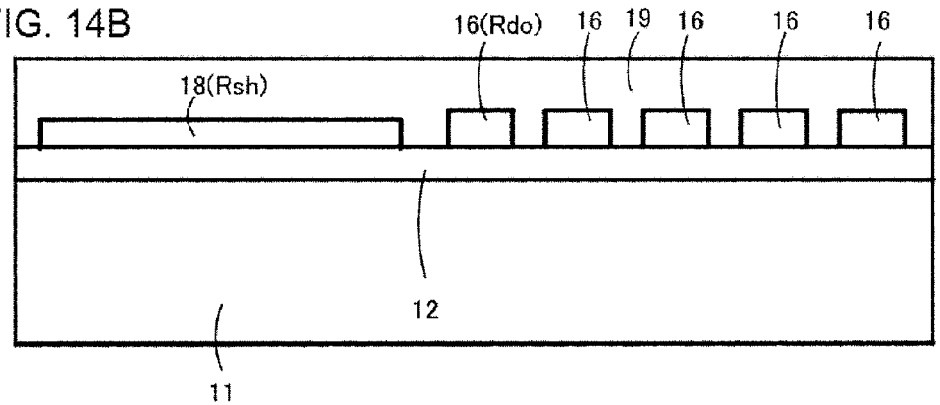

FIGS. 14A and 14B are explanatory views showing the configuration of a main part of a semiconductor device 600 according to Embodiment 6 of the invention. FIG. 14A is a main part plan view showing a shunt resistor Rsh and a voltage division ratio adjustment resistor Rdo. FIG. 14B is a main part sectional view taken along the line Y-Y in FIG. 14A. These FIG. 14A and FIG. 14B show a modification corresponding to FIGS. 3 and 4D of Embodiment 1 respectively.

The semiconductor device 600 according to Embodiment 6 is different from the semiconductor device 100 according to Embodiment 1 in the point that the shunt resistor Rsh is formed as a polysilicon resistor 18 and the voltage division ratio adjustment resistor Rdo is also formed as a polysilicon resistor 16. The configuration of the polysilicon resistor 18 is the same as that in Embodiment 5. The configuration of the polysilicon resistor 16 is the same as that in Embodiment 2.

Next, a semiconductor device in which the area occupied by a current detection circuit can be reduced will be described.

Embodiment 7

Figure 15A:
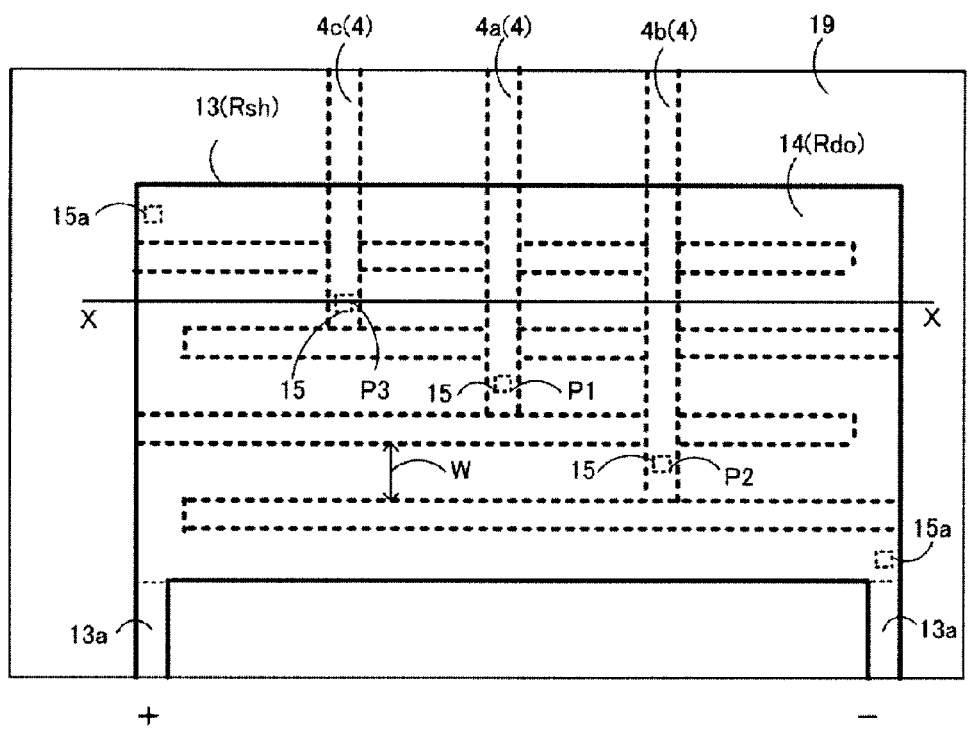
FIGS. 15A and 15B are explanatory views showing the configuration of a main part of a semiconductor device 700 according to Embodiment 7 of the invention.
Figure 15B:
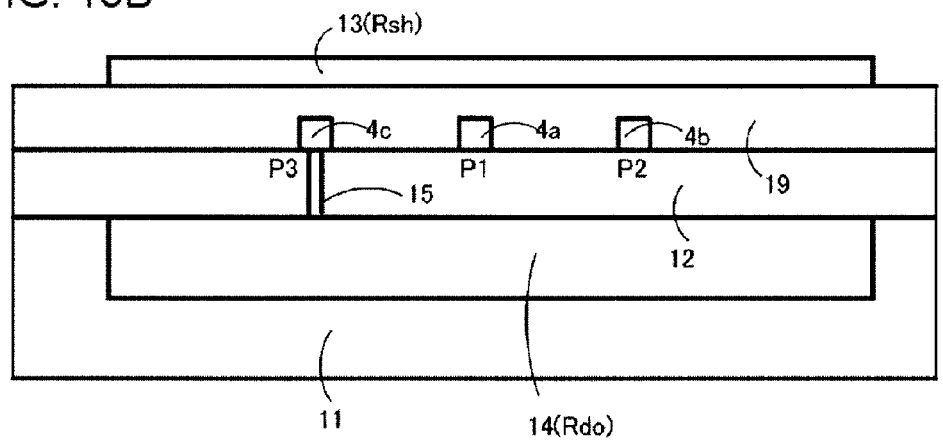

FIGS. 15A and 15B are explanatory views showing the configuration of a main part of a semiconductor device 700 according to Embodiment 7 of the invention. FIG. 15A is a main part plan view showing a shunt resistor Rsh and a voltage division ratio adjustment resistor Rdo. FIG. 15B is a main part sectional view taken along the line X-X in FIG. 15A. These FIG. 15A and FIG. 15B show a modification corresponding to FIG. 3 and FIG. 4A of Embodiment 1 respectively.

The semiconductor device 700 according to Embodiment 7 is different from the semiconductor device 100 according to Embodiment 1 in the point that the voltage division ratio adjustment resistor Rdo is formed as a diffused resistor 14 and an Al—Si—Cu metal wire 13 serving as the shunt resistor Rsh is laminated on the diffused resistor 14. Since the Al—Si—Cu metal wire 13 is laminated on the diffused resistor 14, the area occupied by the current detection circuit can be reduced.

For example, the Al—Si—Cu metal wire 13 serving as the shunt resistor Rsh is laminated on the voltage division ratio adjustment resistor Rdo (diffused resistor 14) with interposition of an insulating film 12 and an insulating film 19 so that the Al—Si—Cu metal wire 13 can be opposed to the diffused resistor 14. Detected voltage lines 4 are formed on the insulating film 12. The detected voltage lines 4 are covered with the insulating film 19 and the Al—Si—Cu metal wire 13 is formed on the insulating film 19. The voltage division ratio adjustment resistor Rdo is formed in such a manner that the diffused resistor 14 is disposed zigzag under the shunt resistor Rsh and led out through the detected voltage lines 4 from the voltage division points P1, P2 and P3 (places of the contact holes 15). The detected voltage lines 4 and the Al—Si—Cu metal wire 13 are formed into a double-layer structure with interposition of the insulating layer 19. In this configuration, the detected voltage lines 4a, 4b and 4c can be led out from the voltage division points P1, P2 and P3 under the shunt resistor Rsh. In addition, since a large current is not applied to the voltage division ratio adjustment resistor Rdo, the resistance width W of the voltage division ratio adjustment resistor Rdo can be made narrow. The voltage division ratio adjustment resistor Rdo to which a large number of detected voltage lines 4 are connected can be disposed under the shunt resistor Rsh which is formed as the Al—Si—Cu metal wire 13 and has a relatively large area. Accordingly, since the voltage division ratio adjustment resistor Rdo having high resistance is used, a large resistance difference can be secured between adjacent voltage division points even if the number of voltage division points is increased. Accordingly, a large number of the detected voltage lines 4 can be led out so that the degree of freedom in adjustment of the voltage division ratio can be widened.

Embodiment 8

Figure 16A:
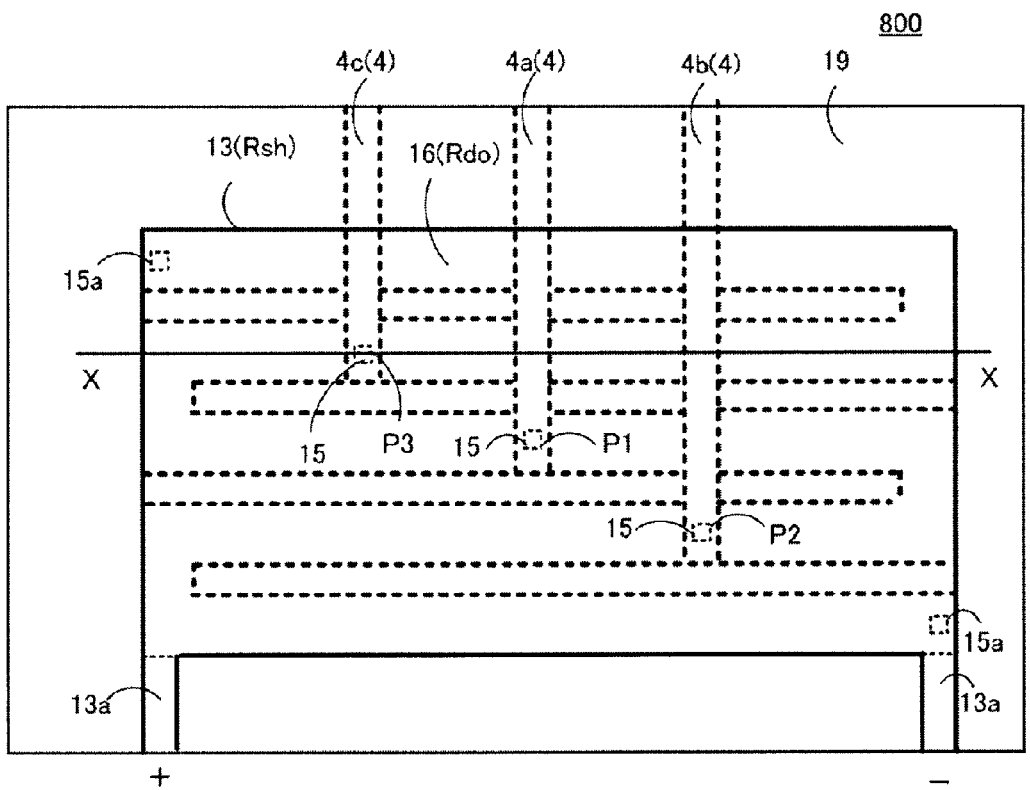
FIGS. 16A and 16B are explanatory views showing the configuration of a main part of a semiconductor device 800 according to Embodiment 8 of the invention.
Figure 16B:
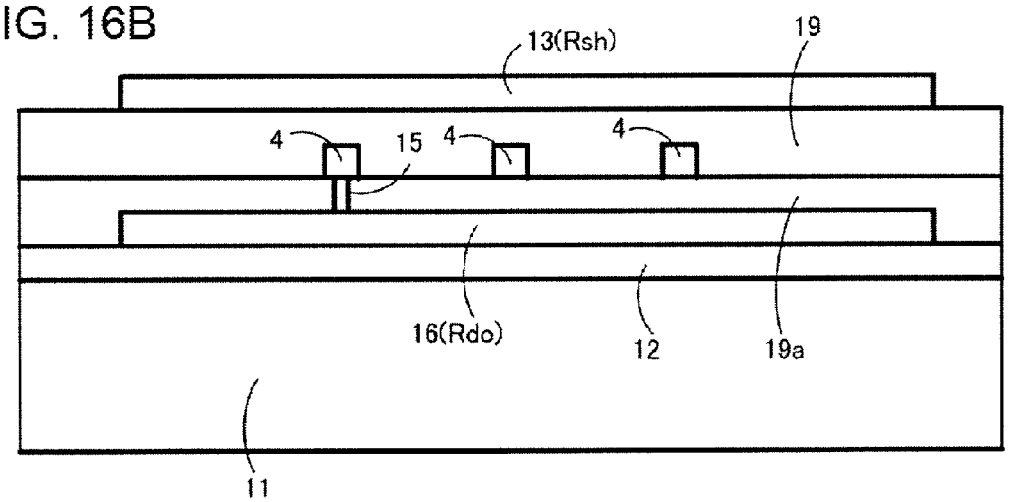

Next, the configuration of a semiconductor device according to Embodiment 8 of the invention will be described. FIGS. 16A and 16B are explanatory views showing the configuration of a main part of a semiconductor device 800 according to Embodiment 8 of the invention. FIG. 16A is a main part plan view showing a shunt resistor Rsh and a voltage division ratio adjustment resistor Rdo. FIG. 16B is a main part sectional view taken along the line X-X in FIG. 16A.

The semiconductor device 800 according to Embodiment 8 is different from the semiconductor device 700 according to Embodiment 7 in the point that the voltage division ratio adjustment resistor Rdo is formed as a polysilicon resistor 16 and an Al—Si—Cu metal wire 13 serving as the shunt resistor Rsh is laminated on the polysilicon resistor 16. Specifically, the Al—Si—Cu metal wire 13 is laminated on the polysilicon resistor 16 with interposition of an insulating film 19a and an insulating film 19. When the Al—Si—Cu metal wire 13 is laminated on the polysilicon resistor 16, the area occupied by the current detection circuit can be reduced. The configuration of the polysilicon resistor 16 is the same as that in Embodiment 2. The polysilicon resistor 16 is covered with the insulating film 19a and detected voltage lines 4 are formed on the insulating film 19a. The configuration of the Al—Si—Cu metal wire 13 serving as the shunt resistor Rsh is the same as that in Embodiment 7.

The function of any of the aforementioned semiconductor devices 200, 300, 400, 500, 600, 700 and 800 according to Embodiments 2 to 8 is the same as the function of the aforementioned semiconductor device 100 according to Embodiment 1.

Here, the aforementioned contents will be described briefly.

Figure 17:
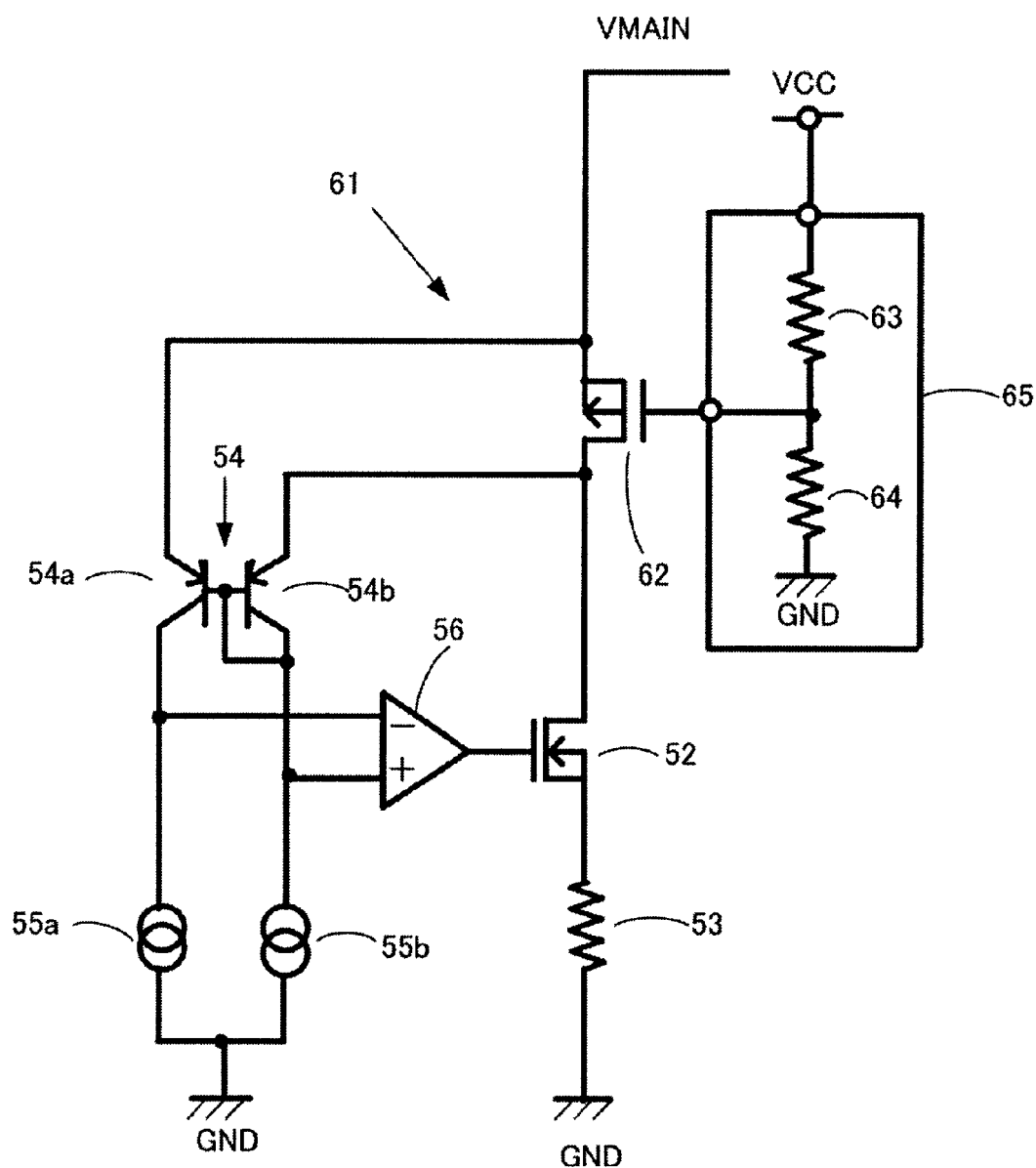
FIG. 17 is a circuit diagram showing the circuit configuration of a current detection circuit according to the background art.
Figure 18:
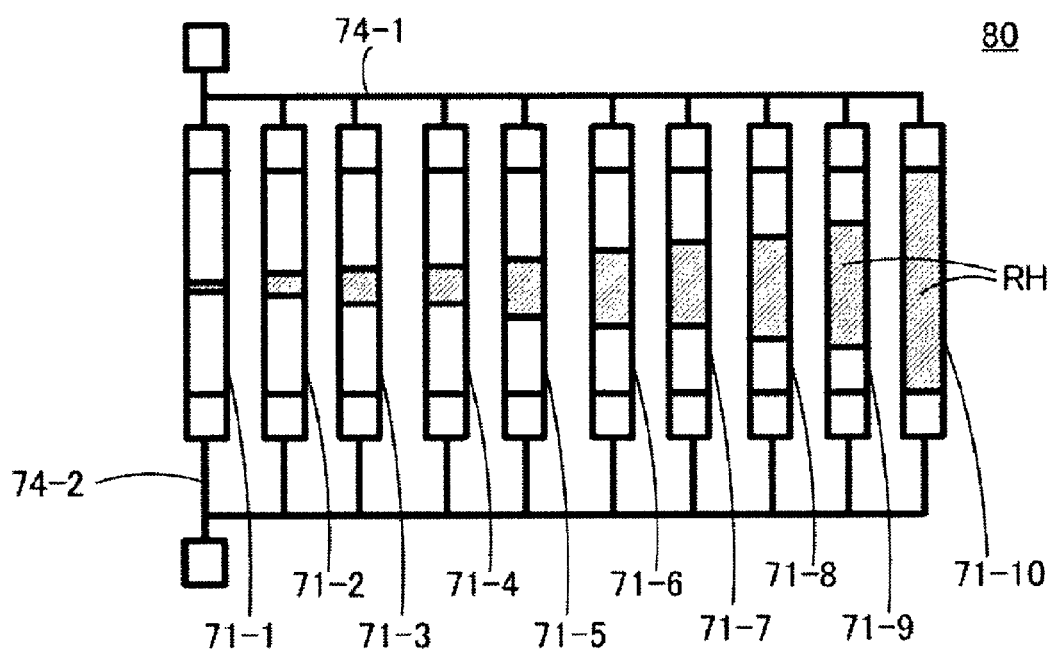
FIG. 18 is a plan view showing a main part of the configuration of a trimming resistor element 80 according to the background art.

As described above, each of the current detection circuits (denoted by the reference signs 101, 102, etc.) of the semiconductor devices 100, 200, 300, 400, 500, 600, 700 and 800 according to Embodiments 1 to 8 of the invention is provided with the shunt resistor Rsh, the voltage division ratio adjustment resistor Rdo which is disposed in parallel with the shunt resistor Rsh, and the selection circuit 1. According to Embodiments 1 to 8, a desired voltage division ratio is selected by the selection circuit 1 so that a voltage converted by the shunt resistor Rsh can be adjusted (trimmed) to a target detected voltage Vs. Since selection of the detected voltage lines 4 by the selection circuit 1 can be controlled digitally, the current detection circuit can be simpler than the background-art analog control shown in FIG. 17. In addition, the voltage division ratio of the voltage division ratio adjustment resistor Rdo is selected so that the voltage can be adjusted to a target detected voltage Vs. Accordingly, the resistance value of the voltage division ratio adjustment resistor Rdo can be increased and the current flowing into the voltage division ratio adjustment resistor Rdo can be reduced. As a result, power consumption of the voltage division ratio adjustment resistor Rdo can be reduced. Moreover, since ON/OFF of the MOSFETs 2 is used for selection of the detected voltage lines 4, trimming elements each with a comparatively large resistance value, such as the Zener Zaps 3 or the fuses 40 can be used for ON/OFF of the gates G of the MOSFETs 2.

Embodiment 9

Figure 19:
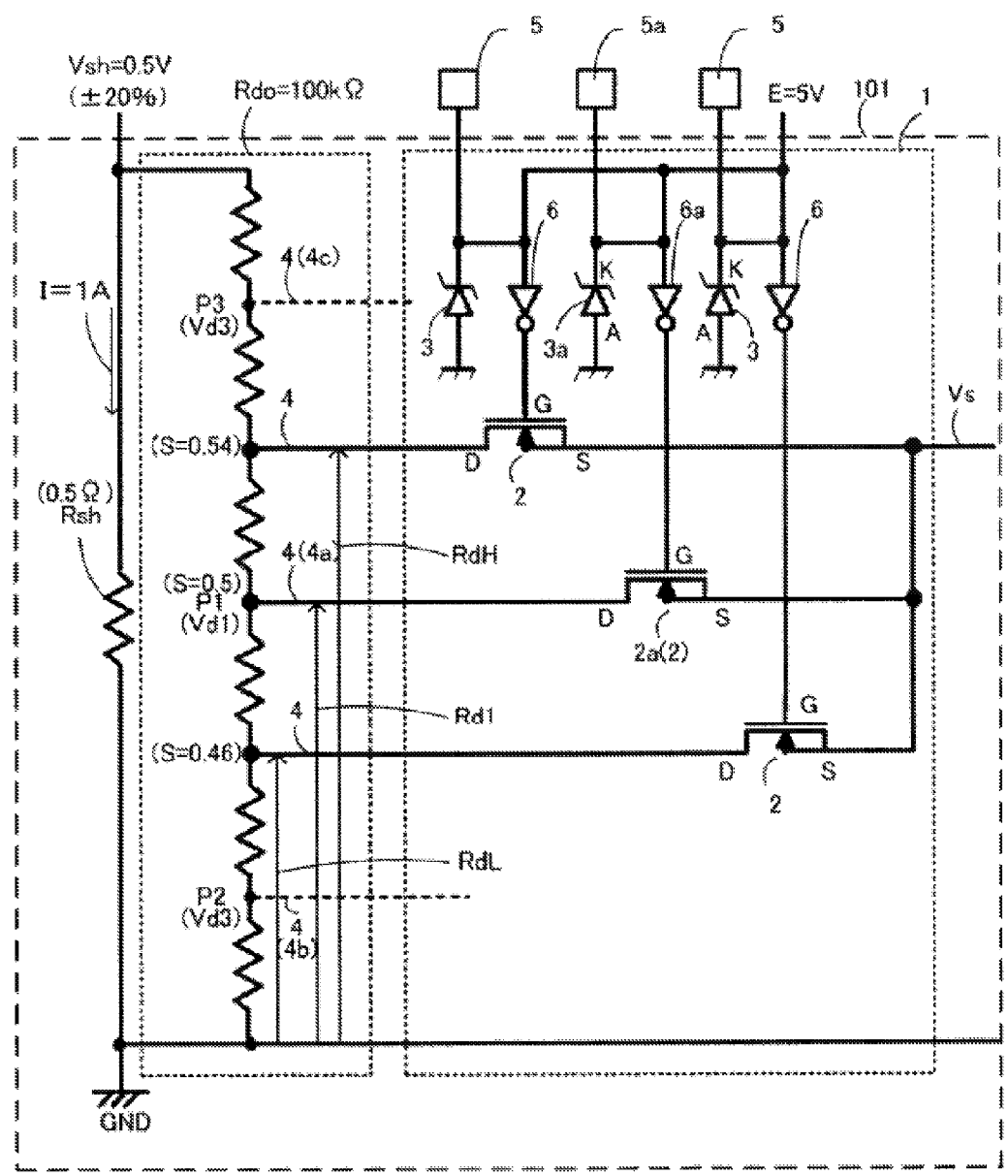
FIG. 19 is an explanatory view showing a method for manufacturing a semiconductor device according to Embodiment 9 of the invention.

Next, a method for manufacturing a semiconductor device according to Embodiment 9 of the invention will be described. FIG. 19 is an explanatory view showing the method for manufacturing a semiconductor device according to Embodiment 9 of the invention. A method in which one is selected from detected voltage lines 4 by a selection circuit 1 using Zener Zaps 3 as described in Embodiment 1 so that the resistance value of a voltage division ratio adjustment resistor Rdo can be adjusted (trimmed) will be described here. Incidentally, the selection circuit 1 can select one from the detected voltage lines 4 as follows in the same manner as the selection circuit 1a (FIG. 8) which uses the fuses 40 in place of the Zener Zaps 3 and which has been described as the other example of Embodiment 1.

The reference sign Rshav denotes an average value of variation of the resistance value of the shunt resistor Rsh; RshH, a higher resistance value than the average value Rshav, and RshL, a lower resistance value than the average value Rshav. The reference sign Rd1 denotes the resistance value of a predetermined point of the voltage division ratio adjustment resistor Rdo; RdH, a higher resistance value than the resistance value Rd1, and RdL, a lower resistance value than the resistance value Rd1. The reference sign So denotes a voltage division ratio for the resistance value Rd1, SH, a voltage division ratio for the resistance value RdH; and SL, a voltage division ratio for the resistance value RdL. In this case, the voltage division ratios So, SH and SL are determined to make the product Rshav×So, the product RshH×SL and the product RshL×SH substantially equal in value to one another (Rshav×So≈RshH×SL≈RshL×SH) and one is selected from the voltage division ratios So, SH and SL by the selection circuit 1.

A method for selecting a voltage division ratio by the selection circuit 1 will be described specifically.

First, the average value Rshav of the variation of the resistance value of the shunt resistor Rsh is set at 0.5Ω and the variation is set to be ±20%. In this manner, the maximum resistance value Rshmax of the shunt resistor Rsh is 0.5Ω× 1.2 (=0.6Ω) and the minimum resistance value Rshmin of the shunt resistor Rsh is 0.5Ω×0.8 (=0.4Ω). A current of 1 A flows into the shunt resistor Rsh. The average value Vshav, the maximum value Vshmax and the minimum value Vshmin of the voltage generated in the shunt resistor Rsh are 0.5 V, 0.6 V and 0.4 V respectively.

Next, the resistance value of the voltage division ratio adjustment resistor Rdo is set at 100 kΩ.

Next, the resistance value of the voltage division resistor Rd1 as a reference value of the voltage division ratio adjustment resistor Rdo is set at 50 kΩ. This means that the voltage division ratio So is set to establish the relation So=Rd1/Rdo=0.5.

Next, a low voltage division resistor having the minimum resistance value with respect to the voltage division resistor Rd1 as the center is set as Rd2, and a high voltage division resistor having the maximum resistance value likewise is set as Rd3. This means that the voltage division ratio S2 and S3 are set to establish the relation S2=Rd2/Rdo and the relation S3=Rd3/Rdo.

Next, when the resistance value of the shunt resistor Rsh varies to be the resistance value RshH higher than the resistance value Rshav (=0.5Ω), the selection circuit 1 selects a detected voltage line 4 connected to a voltage division point closest to a voltage division ratio SL which is equal to 0.5/(RshH/Rsh). When the resistance value of the shunt resistor Rsh varies to be the resistance value RshL lower than the resistance value Rshav, the selection circuit 1 selects a detected voltage line 4 connected to a voltage division point closest to a voltage division ratio SH which is equal to 0.5/(RshL/Rsh).

When, for example, the resistance value RshH is 0.54Ω as illustrated, the voltage division ratio SL is 0.5/(0.54 Ω/0.5Ω) (=0.463). Accordingly, the selection circuit 1 selects a detected voltage line 4 connected to a voltage division point PL of a voltage division ratio (for example, 0.46) closest to the voltage division ratio SL. In this manner, the voltage (detected voltage Vs) of the detected voltage line 4 is 0.54 V×0.46 (=0.25 V) although the voltage generated in the place of the resistance value RshH is 0.54Ω×1 A (=0.54 V).

On the other hand, in the case of the average value Rshav of the shunt resistor Rsh, the voltage generated in the shunt resistor Rsh is 0.5Ω×1 A (=0.5 V). A divided voltage Vd1 generated at the corresponding voltage division ratio So (0.5) of the voltage division ratio adjustment resistor Rdo is 0.5 V×0.5 (=0.25 V). Therefore, even when the resistance value of the shunt resistor Rsh varies, a constant detected voltage Vs of 0.25 V can be outputted from the detected voltage line 4 selected by the selection circuit 1.

In addition, when, for example, the resistance value RshL is 0.46Ω, the voltage division ratio SH is 0.5/(0.46Ω/0.5Ω) (=0.543). Accordingly, the selection circuit 1 selects a detected voltage line 4 connected to a voltage division ratio (for example, 0.54) closest to the voltage division ratio SH. In this manner, the voltage (detected voltage Vs) of the detected voltage line 4 is 0.46 V×0.54 (=0.25 V) although the voltage generated in the place of the resistance value RshL is 0.46Ω×1 A (=0.46 V).

That is, the variation of the resistance value of the shunt resistor Rsh is cancelled so that a constant detected voltage Vs can be outputted from the detected voltage line 4 selected by the selection circuit 1.

As described above, the selection circuit 1 selects one from the detected voltage lines 4 as follows. First, the voltage (=5 V) of the power supply E is applied to one Zener Zap 3 which serves as a trimming element and which constitutes the selection circuit 1, and the Zener Zap 3 is short-circuited. Then, the voltage of 5 V is applied to the gate G of a corresponding MOSFET 2 and the MOSFET 2 turns ON. When the MOSFET 2 is in an ON state, a divided voltage (VL or VH) of a voltage division point of the voltage division ratio adjustment resistor Rdo to which a corresponding detected voltage line 4 connected to the drain D of the MOSFET 2 is connected is selected. As a result, a detected voltage Vs can be outputted from the source S of the MOSFET 2 connected to the voltage division point of the voltage division point adjustment resistor Rdo selected by the selection circuit 1.

Embodiment 10

Figure 20:
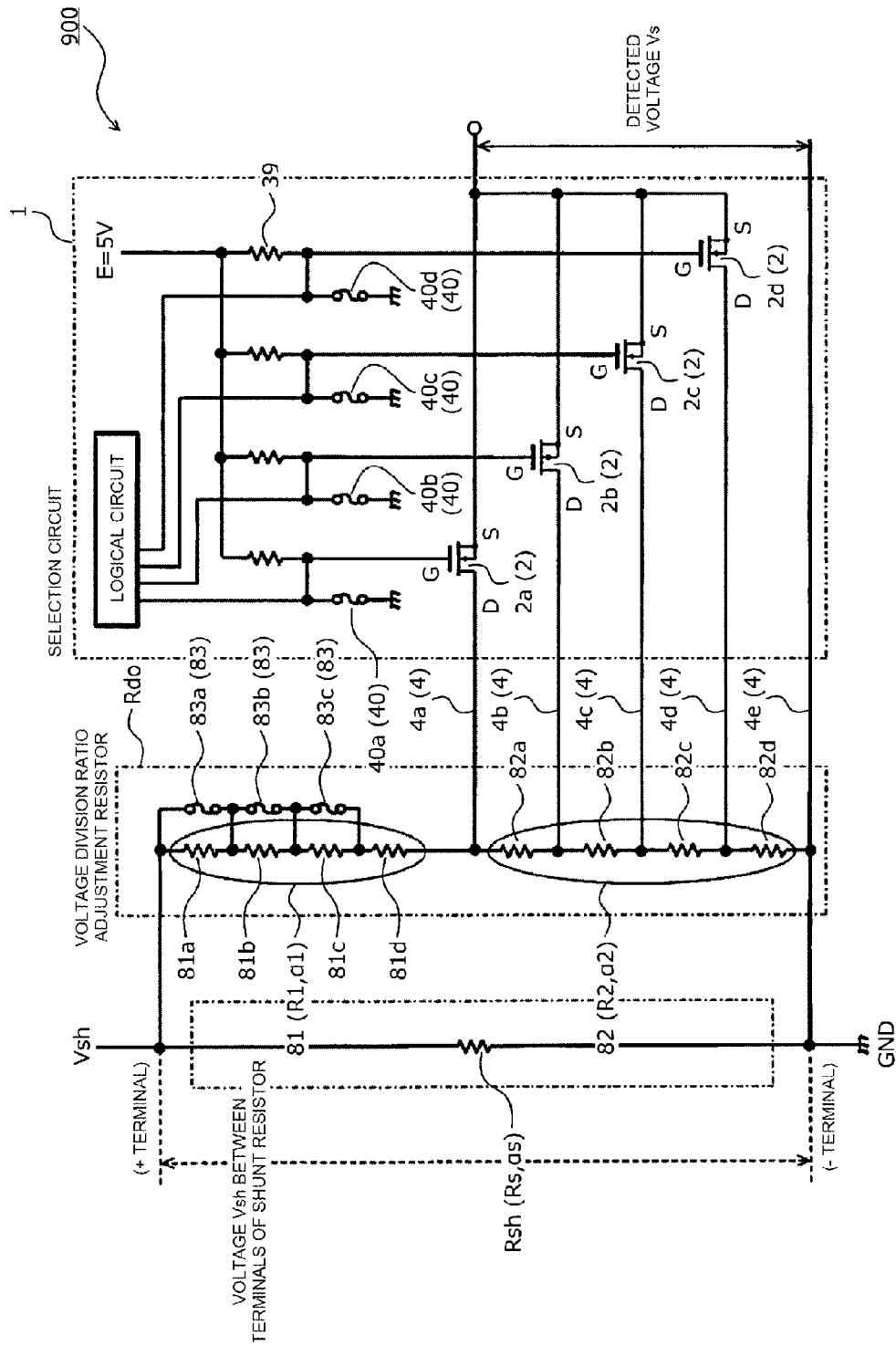
FIG. 20 is a circuit diagram showing the circuit configuration of a semiconductor device 900 according to Embodiment 10 of the invention.
Figure 21:
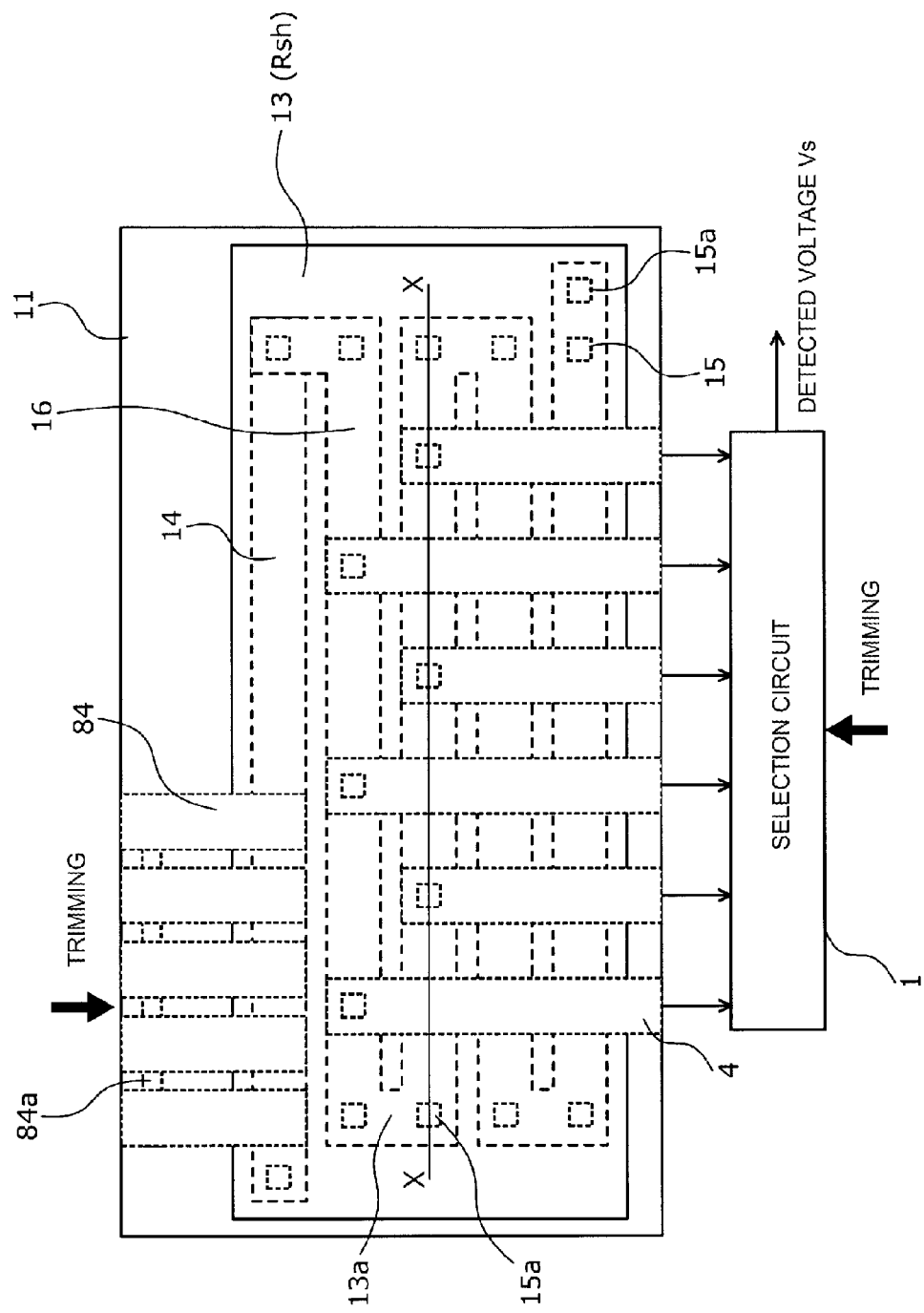
FIG. 21 is a plan view showing the configuration of a main part of the semiconductor device 900 according to Embodiment 10 of the invention.
Figure 22:
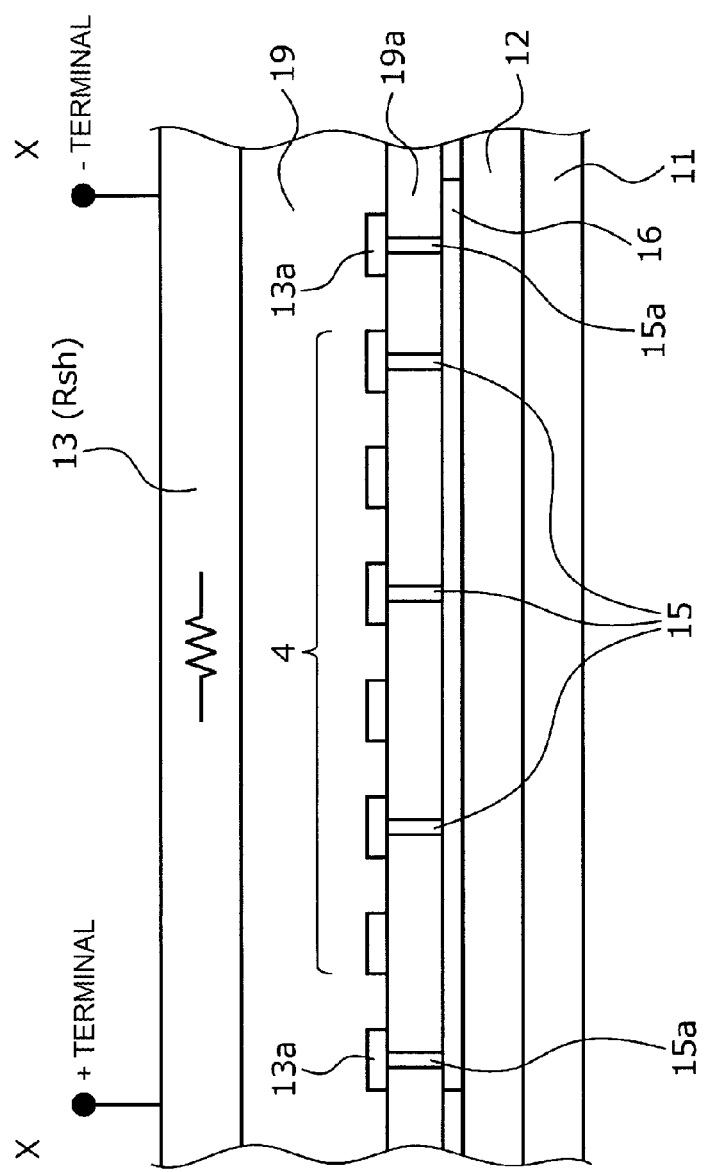
FIG. 22 is a sectional view showing a sectional structure taken along the line X-X in FIG. 21.

Next, the configuration of a semiconductor device according to Embodiment 10 of the invention will be described. FIG. 20 is a circuit diagram showing the circuit configuration of a semiconductor device 900 according to Embodiment 10 of the invention. FIG. 21 is a plan view showing the configuration of a main part of the semiconductor device 900 according to Embodiment 10 of the invention. FIG. 22 is a sectional view showing a sectional structure taken along the line X-X in FIG. 21. FIGS. 21 and 22 show a shunt resistor Rsh and a voltage division ratio adjustment resistor Rdo. These FIGS. 21 and 22 are explanatory views showing a modification corresponding to FIGS. 3 and 4A of Embodiment 1 respectively.

The semiconductor device 900 according to Embodiment 10 is different from the semiconductor device 100 according to Embodiment 1 in the point that a voltage division ratio adjustment resistor Rdo having two or more kinds of voltage division resistors is provided and the temperature coefficient of the voltage division ratio adjustment resistor Rdo is set at an appropriate value so that a detected voltage Vs can be corrected in accordance with an operating temperature (hereinafter this will be referred to as temperature correction of the detected voltage Vs). That is, the semiconductor device 900 according to Embodiment 10 has a function of performing temperature correction of the detected voltage Vs, in addition to a function of correcting the detected voltage Vs when the resistance value Rs of the shunt resistor Rsh changes due to variation of the manufacturing process. Specifically, when the resistance value Rs of the shunt resistor Rsh changes due to variation of the manufacturing process, the voltage division ratio of the voltage division ratio adjustment resistor Rdo is adjusted to correct the detected voltage Vs in the same manner as in Embodiment 1. In addition, when the temperature coefficient or the resistance value of the voltage division ratio adjustment resistor Rdo changes, the resistance value of the voltage division ratio adjustment resistor Rdo is adjusted to perform temperature correction of the detected voltage Vs.

As shown in FIG. 20, first and second voltage division resistors 81 and 82 having different resistance values and different temperature coefficients are connected in series in the voltage division ratio adjustment resistor Rdo. One end of the first voltage division resistor 81 is connected to a high potential side (+ terminal side) of the shunt resistor Rsh. The other end of the first voltage division resistor 81 is connected to one end of the second voltage division resistor 82. The other end of the second voltage division resistor 82 is connected to a low potential side (− terminal side) of the shunt resistor Rsh, that is, connected to the ground GND. A plurality of resistors 81a to 81d are connected in series in the first voltage division resistor 81. Fuses 83a to 83c are connected in parallel with the high potential-side resistors 81a to 81c constituting the first voltage division resistor 81, respectively. One or more fuses of the fuses 83a to 83c are blown out, for example, by laser trimming etc. in the completed current detection circuit. The resistors 81a to 81d connected in parallel with the blown ones of the fuses 83a to 83c are activated so that a resistance value R1 of the first voltage division resistor 81 can be adjusted. In this manner, the temperature coefficient of the voltage division ratio adjustment resistor Rdo can be set at an appropriate value.

A plurality of resistors 82a to 82d are connected in series in the second voltage division resistor 82. The second voltage division resistor 82 is connected to the selection circuit 1 in the same manner as in Embodiment 1. Specifically, detected voltage lines 4a, 4b, 4c and 4d are connected to a connection point (voltage division point) between the first voltage division resistor 81 and the second voltage division resistor 82 and connection points (voltage division points) of the resistors 82a to 82d of the second voltage division resistor 82, respectively. The detected voltage lines 4a, 4b, 4c and 4d are connected to drains D of MOSFETs 2a, 2b, 2c and 2d respectively. Gates G of the MOSFETs 2a, 2b, 2c and 2d are connected to a power supply E through resistors 39 and connected to the ground GND through fuses 40 (40a, 40b, 40c and 40d) respectively in the same manner as in the other example (FIG. 8) of Embodiment 1. In this case, for example, the resistor 82a is set at a central value of the voltage division ratio adjustment resistor Rdo. Pads to which a current for blowing out the fuses 40 is supplied are not shown in FIG. 20.

The selection circuit 1 selects a desired one from the detected voltage lines 4 by a selection circuit (logical circuit). A current is applied to a corresponding one of the fuses 40 connected to the selected desired detected voltage line 4 so as to blow out the fuse 40. A corresponding one of the MOSFETs 2 connected to the blown fuse 40 turns ON and the voltage (divided voltage) of the detected voltage line 4 connected to the MOSFET 2 which is in an ON state is extracted as a detected voltage Vs. That is, when the resistance value Rs of the shunt resistor Rsh changes due to variation of the manufacturing process or when the resistance value Rs of the shunt resistor Rsh varies after assembling such as wire bonding is performed, the voltage division ratio of the second voltage division resistor 82 is adjusted by trimming in the same manner as in the other example of Embodiment 1 so that the desired detected voltage Vs can be obtained. Accordingly, due to the first and second voltage division resistors 81 and 82, the detected voltage Vs can be made constant in spite of the variation of the manufacturing process and the operating temperature environment. Zener Zaps may be used as trimming elements in the same manner as in Embodiment 1 and in place of the fuses 40.

As shown in FIGS. 21 and 22, the aforementioned shunt resistor Rsh and the aforementioned voltage division ratio adjustment resistor Rdo (first and second voltage division resistors 81 and 82) are disposed on the same n semiconductor substrate 11. Specifically, the first voltage division resistor 81 consists of a p diffused region (diffused resistor 14), for example, with a linear planar shape, which is formed by selectively diffusing p-type impurities in a surface layer of then semiconductor substrate 11 covered with an insulating film 12. The configuration of the diffused resistor 14 is the same as that in Embodiment 1. A plurality of wires 84, for example, made of Al—Si—Cu are connected to the diffused resistor 14. Adjacent ones of the wires 84 are connected to each other, for example, through a metal wire layer 84a which is used for laser trimming and which serves as fuses 83a to 83c. In addition, the first voltage division resistor 81 may be a polysilicon resistor in the same manner as in Embodiment 2.

The second voltage division resistor 82 is, for example, constituted by a polysilicon resistor 16 and disposed on the n semiconductor substrate 11 through the insulating film 12 such as an LOCOS insulating film. The polysilicon resistor 16 is formed in such a manner that a plurality of polysilicon resistors each having a linear planar shape and disposed in a stripe shape extending in parallel with the diffused resistor 14 are connected zigzag by wires 13a through contract holes 15a of an insulating film. 19a. The wires 13a are, for example, made of Al—Si—Cu. One end of the polysilicon resistor 16 is connected to one end of the diffused resistor 14 through a contact hole 15 of the insulating layer 12. In addition, the polysilicon resistor 16 is covered with the insulating film 19a and detected voltage lines 4 are formed on the insulating film 19a. Moreover, the second voltage division resistor 82 may be a diffused resistor in the same manner as in Embodiment 1.

Temperature coefficients α1 and α2 of the first and second voltage division resistors 81 and 82 may be adjusted, for example, by dose amounts of ion implantation. For example, the temperature coefficient α2 of the second voltage division resistor 82 is made smaller than the temperature coefficient α1 of the first voltage division resistor 81 (for example, about ±50 ppm/° C. or lower). The temperature coefficient α1 of the first voltage division resistor 81 may be set to satisfy the following expression (1). The reason is that the temperature coefficient of the voltage division ratio adjustment resistor Rdo can be adjusted without substantially depending on the temperature coefficient α2 of the second voltage division resistor 82. In the following expression (1), the temperature coefficient α2 of the second voltage division resistor 82 is set to be substantially equal to 0. The reference signs R1 and α1 denote the resistance value and the temperature coefficient of the first voltage division resistor 81 respectively; R2 and α2, the resistance value and the temperature coefficient of the second voltage division resistor 82 respectively; and Rs and as, the resistance value and the temperature coefficient of the shunt resistor Rsh respectively.

$$\alpha 1 = \alpha s \times ((R1+R2)/R1) \quad (1)$$

The detected voltage lines 4 are connected to the voltage division points of the second voltage division resistor 82 constituted by the polysilicon resistor 16 to lead the second voltage division resistor 82 to the outside. The shunt resistor Rsh is constituted by an Al—Si—Cu metal wire 13 disposed on the diffused resistor 14 and the polysilicon resistor 16 through insulating films in the same manner as in Embodiments 7 and 8. That is, the insulating films 12, 19a and 19 are interposed between the Al—Si—Cu metal wire 13 and the diffused resistor 14. The insulating films 19a and 19 are interposed between the Al—Si—Cu metal wire 13 and the polysilicon resistor 16. When the Al—Si—Cu metal wire 13 is laminated on the diffused resistor 14 and the polysilicon resistor 16 in this manner, the area occupied by the current detection circuit can be reduced.

Figure 23:
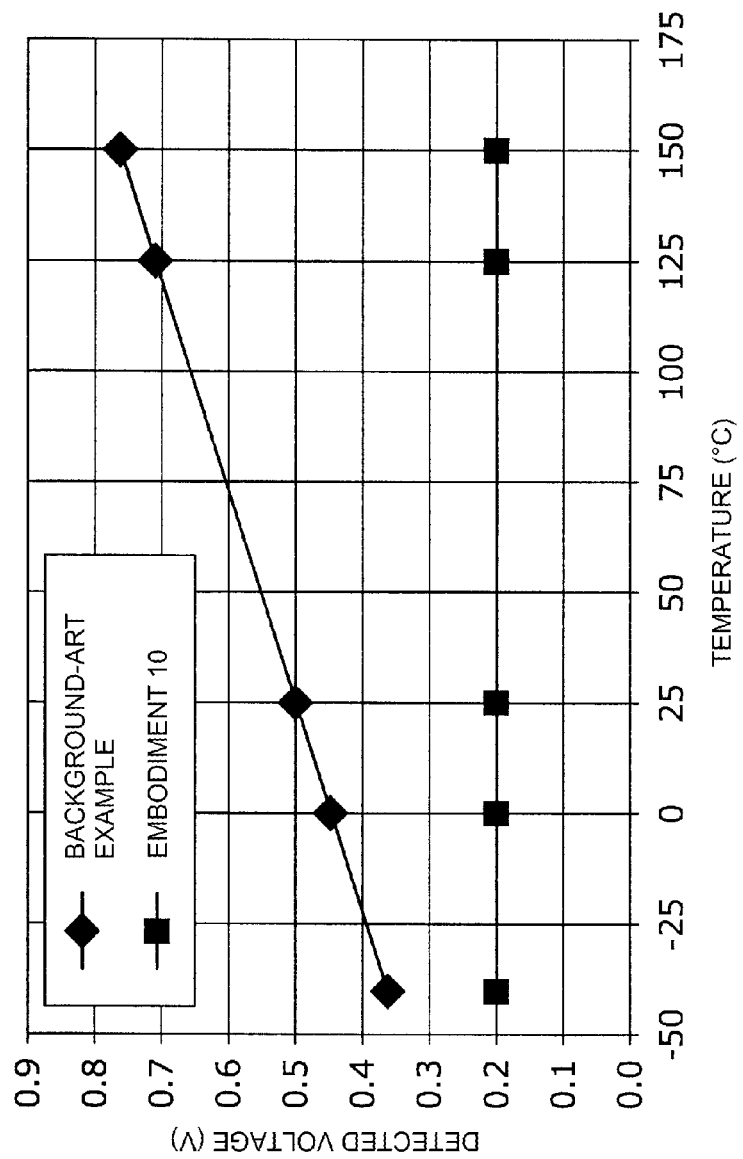
FIG. 23 is a characteristic graph showing temperature dependence of a detected voltage outputted by the semiconductor device 900 according to Embodiment 10 of the invention.

Next, temperature dependence of the detected voltage outputted by the semiconductor device 900 according to Embodiment 10 will be described. FIG. 23 is a characteristic graph showing temperature dependence of the detected voltage outputted by the semiconductor device 900 according to Embodiment 10 of the invention. First, the semiconductor device 900 was manufactured in accordance with Embodiment 10. The shunt resistor Rsh was constituted by the Al—Si—Cu metal wire 13. The resistance value Rs and the temperature coefficient αs of the shunt resistor Rsh were set at 0.5Ω and 4,300 ppm/° C. respectively. The first voltage division resistor 81 was constituted by the diffused resistor 14. The resistance value R1 and the temperature coefficient α1 of the first voltage division resistor 81 were set at 5 kΩ and 8,600 ppm/° C. respectively. The second voltage division resistor 82 was constituted by the polysilicon resistor 16. The resistance value R2 and the temperature coefficient α2 of the second voltage division resistor 82 were set at 50 kΩ and ±50 ppm/° C. or lower respectively. These temperature coefficients are set on the basis of 25° C.

When the temperature coefficient α1 of the first voltage division resistor 81 or the resistance value R1 or R2 of the first or second voltage division resistor 81 or 82 was out of its target value in a wafer test stage after a wafer process, the resistance value R1 of the first voltage division resistor 81 was adjusted by laser trimming. In this Embodiment 10, the detected voltage Vs was measured under a product operating temperature environment (for example, within the range of from −40° C. to 150° C.) A result of the measurement is shown in FIG. 23. As comparison, a result of measurement of a voltage Vsh between two terminals of a shunt resistor Rsh as a detected voltage in the same product operating temperature environment as that in Embodiment 10 is shown in FIG. 23 (hereinafter referred to as background-art example). From the result shown in FIG. 23, the detected voltage was higher as the operating temperature environment was higher in the background-art example. On the other hand, it has been confirmed that a constant detected voltage Vs can be obtained in spite of the product operating temperature environment in Embodiment 10 of the invention.

As described above, according to Embodiment 10, it is possible to obtain the same effects as those according to any of Embodiments 1 to 9. In addition, according to Embodiment 10, it is possible to adjust the resistance value of the first voltage division resistor to set the temperature coefficient of the voltage division ratio adjustment resistor at an appropriate value, and it is possible to adjust the voltage division ratio of the second voltage division resistor to correct variation of the detected voltage caused by variation of the resistance value of the shunt resistor. Thus, it is possible to output a constant detected voltage in spite of variation of the manufacturing process and the operating temperature environment.

The invention is not limited to the aforementioned Embodiments but may be modified variously without departing from the scope and spirit of the invention.

As described above, the semiconductor device and the method for manufacturing the semiconductor device according to the invention is useful for a semiconductor device, such as a current detection circuit mounted in a system such as an on-vehicle transmission.

What is claimed is:
1. A semiconductor device, comprising:
a current detection circuit, including:
  a current detection resistor,
  a voltage division ratio adjustment resistor which is connected in parallel with the current detection resistor and which is higher in resistance than the current detection resistor, the voltage division ratio adjustment resistor having a plurality of voltage division points at which the voltage division ratio adjustment resistor is divided with different voltage division ratios respectively, and
  a selection circuit, including
    a plurality of switching elements that correspond respectively to the plurality of voltage division points, and
    a plurality of trimming elements that correspond respectively to the plurality of switching elements,
  each trimming element being connected to a gate of the corresponding switching element, a high potential side of which is connected to the corresponding voltage division point, wherein
  the current detection resistor, the voltage division ratio adjustment resistor and the selection circuit are provided in a same semiconductor substrate,
  the selection circuit turns on or off the switching elements to thereby select one of the voltage division points based on a resistance value of the current detection resistor, so that the current detection circuit outputs a voltage at the selected voltage division point as a detected voltage, and the current detection resistor is disposed on the voltage division ratio adjustment resistor through an interlayer insulating film.

2. The semiconductor device according to claim 1, wherein:
the current detection resistor is a diffused resistor.

3. The semiconductor device according to claim 1, wherein:
the current detection resistor is a polysilicon resistor.

4. The semiconductor device according to claim 1, wherein:
the current detection resistor is a metal wire.

5. The semiconductor device according to claim 1, wherein:
the current detection resistor is a diffused resistor.

6. The semiconductor device according to claim 1, wherein:
the current detection resistor is a polysilicon resistor.

7. The semiconductor device according to claim 1, wherein:
the switching elements are metal oxide semiconductor field effect transistors.

8. The semiconductor device according to claim 1, wherein:
the trimming elements are Zener diodes.

9. The semiconductor device according to claim 1, wherein:
the trimming elements are fuses.

10. The semiconductor device according to claim 1, wherein:
the plurality of trimming elements are first trimming elements;
the voltage division ratio adjustment resistor includes:
a first voltage division resistor section;
a second voltage division resistor section which has the voltage division points and which is connected in series with the first voltage division resistor section on a low potential side of the first voltage division resistor section; and
a plurality of second trimming elements which are connected in series with one another and which are connected in parallel with the first voltage division resistor section; and
a resistance value of the first voltage division resistor section is controlled by the plurality of second trimming elements to adjust a temperature coefficient of the voltage division ratio adjustment resistor.

11. The semiconductor device according to claim 10, wherein:
a temperature coefficient of the second voltage division resistor section is smaller than a temperature coefficient of the first voltage division resistor section.

12. A semiconductor device comprising:
a current detection circuit including:
a current detection resistor;
a voltage division ratio adjustment resistor which is connected in parallel with the current detection resistor, the voltage division ratio adjustment resistor having a plurality of voltage division points at which the voltage division ratio adjustment resistor is divided with different voltage division ratios respectively; and
a selection circuit, including
a plurality of switching elements that correspond respectively to the plurality of voltage division points, and
a plurality of trimming elements that correspond respectively to the plurality of switching elements,
each trimming element being connected to a gate of the corresponding switching element, a high potential side of which is connected to the corresponding voltage division point; wherein:
the selection circuit turns on or off the switching elements to thereby select one of the voltage division points based on a resistance value of the current detection resistor so that the current detection circuit outputs a voltage at the selected voltage division point as a detected voltage.

13. The semiconductor device according to claim 1, wherein
the voltage division ratio adjustment resistor is a polysilicon resistor, and
the current detection resistor is made of metal.

14. The semiconductor device according to claim 8, wherein
each Zener diode is connected to the gate of the corresponding switching element via an inverter.

* * * * *